US006429785B1

United States Patent
Griffin et al.

(10) Patent No.: US 6,429,785 B1
(45) Date of Patent: Aug. 6, 2002

(54) REVENUE METER HAVING PRECISION TIME CLOCK

(75) Inventors: Paul M. Griffin; Guy H. Berthiaume, both of Charlotte, NC (US)

(73) Assignee: Siemens Power Transmission & Distribution Inc., Wendell, NC (US)

( * ) Notice: Subject to any disclaimer, the term of this patent is extended or adjusted under 35 U.S.C. 154(b) by 0 days.

(21) Appl. No.: 09/226,957

(22) Filed: Jan. 8, 1999

(51) Int. Cl.$^7$ .......................... G08B 23/00; G08C 15/06
(52) U.S. Cl. ...................... 340/870.02; 340/661; 702/61
(58) Field of Search ............................ 340/870.02, 661; 702/61, 64, 66

(56) References Cited

U.S. PATENT DOCUMENTS

| 4,080,568 A | 3/1978 | Funk |
| 4,114,141 A | 9/1978 | Travis |
| 4,216,527 A | 8/1980 | Emerson et al. |
| 4,218,737 A | 8/1980 | Buscher et al. |
| 4,337,463 A | 6/1982 | Vangern |
| 4,348,730 A | 9/1982 | Emerson et al. |
| 4,400,783 A | 8/1983 | Locke, Jr. et al. |
| 4,530,091 A | 7/1985 | Crockett |
| 4,622,640 A | 11/1986 | Shimamura et al. |
| 4,701,858 A | 10/1987 | Stokers et al. |
| 4,758,962 A | 7/1988 | Fernandes |
| 4,777,381 A | 10/1988 | Fernandes |
| 4,799,005 A | 1/1989 | Fernandes |
| 4,855,671 A | 8/1989 | Fernandes |
| 4,964,065 A | 10/1990 | Hicks et al. |
| 5,027,297 A | 6/1991 | Garitty et al. |
| 5,300,924 A | 4/1994 | McEachern et al. |

(List continued on next page.)

FOREIGN PATENT DOCUMENTS

EP 0 385 102 A1 6/1990
GB 2 266 419 A 10/1993

OTHER PUBLICATIONS

PCT International Search Report, International Application No. PCT/US99/30962; Filing Date: December 23, 1999; and Priority Date: Jan. 8, 1999.
Model GPS–PCI, GPS Synchronizecd PCI Plug–In Card for Computer Clock Synchronization; http://www.truetime-.com/DOCS/PDTS/blgps_pci.html, Copyright 1998 True Time Inc.) No Page No.
Siemens Operator's Manual for type 4720 Power Meter (Copyright 1996 Siemens Energy & Automation, Inc.), pp. 1–86.
Power Measurement brochure of Pegasys™/ ION™ system (Rev 4/95, Imagecraft Limited, Printed in Canada), No page No.
"A Comprehensive Approach to Power Monitoring", by Michael Daish, of Reliable Power Meters, No Page No.
Reliable Power Meters model 1650 PR Power Recorder data sheet, No Page No.

Primary Examiner—Timothy Edward, Jr.

(57) ABSTRACT

An electrical energy meter includes a voltage digitizing circuit, a current digitizing circuit, a metering circuit, a clock circuit, and a source of externally-generated time standard information. The voltage digitizing circuit is operable to obtain analog line voltage information and generated digital line voltage information therefrom. Similarly, the current digitizing circuit is operable to obtain analog line current information and generate digital line current information therefrom. The metering circuit is operable to receive the digital line voltage information and the digital line current information and generate metering information therefrom. The clock circuit is operable to generate calendar/clock information, said clock circuit having a calibration input for receiving precision time calibration information. The source of externally-generated time standard information is operably coupled to provide precision time calibration information to the calibration input of the clock circuit.

23 Claims, 13 Drawing Sheets

U.S. PATENT DOCUMENTS

| | | | |
|---|---|---|---|
| 5,301,122 A | 4/1994 | Halpern | 364/483 |
| 5,307,009 A | 4/1994 | McEachern et al. | |
| 5,315,531 A | 5/1994 | Oravetz et al. | |
| 5,325,048 A | 6/1994 | Longini | |
| 5,406,495 A | 4/1995 | Hill | |
| 5,469,365 A * | 11/1995 | Diekema et al. | 340/870.02 |
| 5,491,473 A | 2/1996 | Gilbert | |
| 5,548,527 A | 8/1996 | Hemminger et al. | |
| 5,600,576 A | 2/1997 | Broadwater et al. | |
| 5,627,759 A | 5/1997 | Bearden et al. | |
| 5,644,173 A | 7/1997 | Elliason et al. | |
| 5,680,324 A | 10/1997 | Schweitzer, III et al. | |
| 5,737,231 A | 4/1998 | Pule et al. | 364/483 |
| 5,737,730 A | 4/1998 | Alvarenga et al. | |
| RE35,793 E | 5/1998 | Halpern | |
| 5,796,631 A | 8/1998 | Iancu et al. | |
| 5,808,902 A | 9/1998 | Levert et al. | |
| 5,995,911 A * | 11/1999 | Hart | 702/64 |
| 6,005,759 A | 12/1999 | Hart et al. | 361/66 |

\* cited by examiner

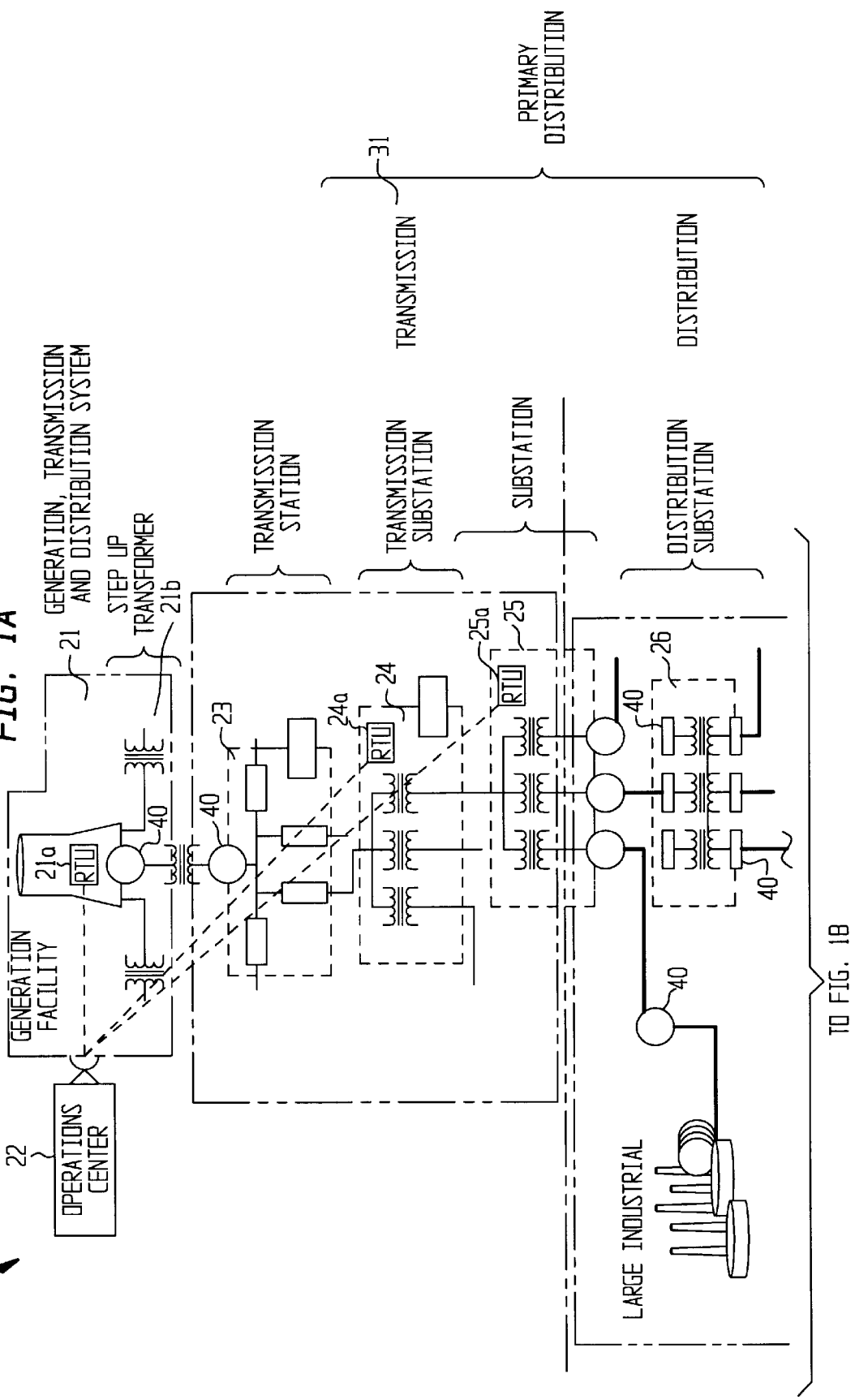

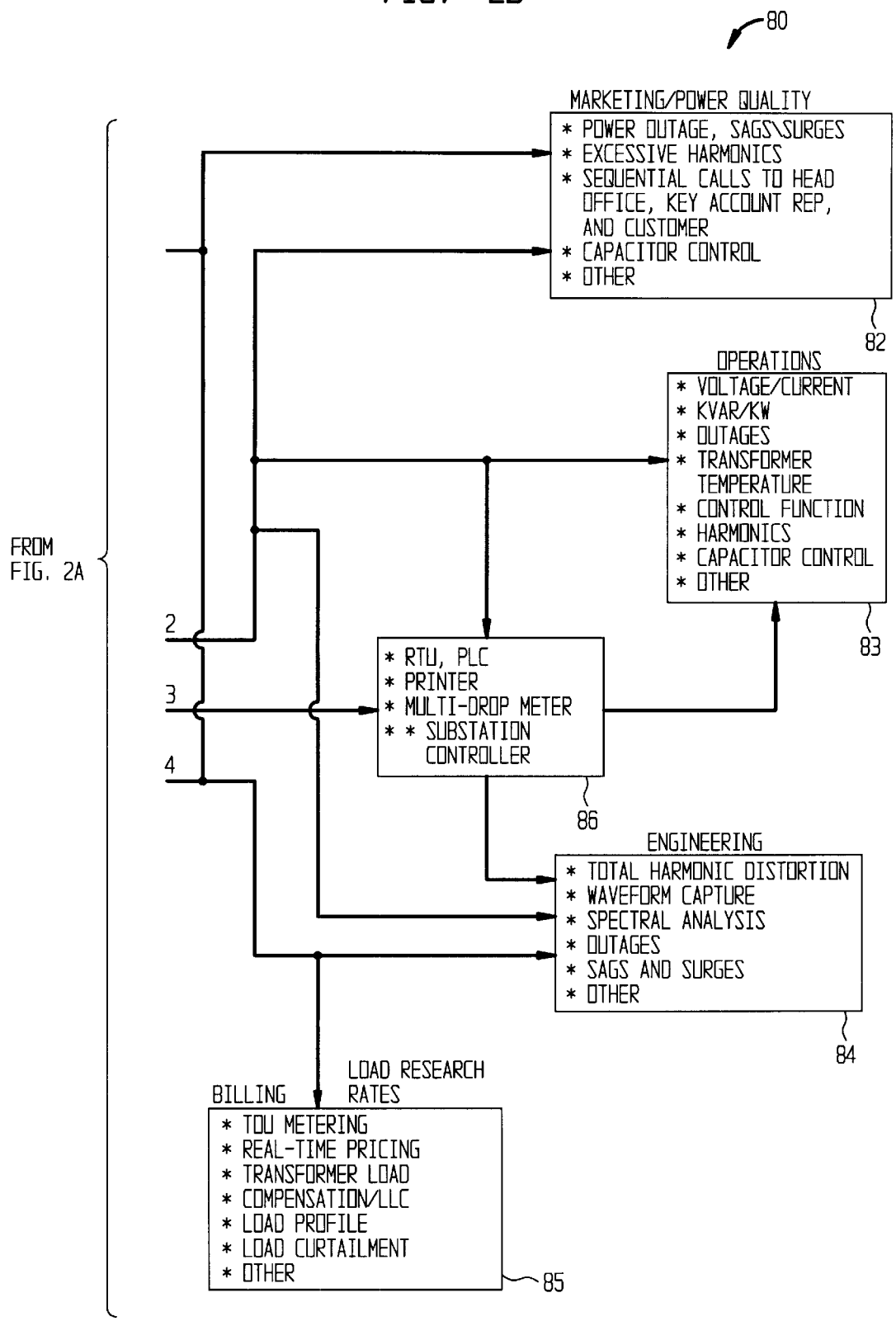

REVENUE METER HAVING PRECISION TIME CLOCK

CROSS REFERENCE TO RELATED APPLICATION

Cross reference is made to U.S. patent application Ser. No. 09/227,434, filed Jan. 8, 1999, which is assigned to the assignee of the present invention.

FIELD OF THE INVENTION

This invention relates to electricity meters such as used by commercial, industrial, or residential customers of power utility companies and, more particularly, to a revenue accuracy meter having various operational capabilities such as power quality measurement and/or energy management.

BACKGROUND OF THE INVENTION

Utility power distribution generally starts with generation of the power by a power generation facility, i.e., power generator or power plant. The power generator supplies power through step-up subtransmission transformers to transmission lines. To reduce power transportation losses, the step-up transformers increase the voltage and reduce the current. The actual transmission line voltage conventionally depends on the distance between the subtransmission transformers and the users or customers. Distribution substation transformers reduce the voltage from transmission line level generally to a range of about 2–35 kilo-volts ("kV"). The primary power distribution system delivers power to distribution transformers that reduce the voltage still further, i.e., about 120 V to 600 V.

For background purposes, and future reference herein, an example of a power utility distribution system as described above and understood by those skilled in the art is illustrated in FIGS. 1A and 1B of the drawings. Power utility companies, and suppliers thereto, have developed systems to analyze and manage power generated and power to be delivered to the transmission lines in the primary power distribution system, e.g., primarily through supervisory control and data acquisition ("SCADA"). These primary power distribution analyzing systems, however, are complex, expensive, and fail to adequately analyze power that is delivered to the industrial, commercial, or residential customer sites through the secondary power distribution system.

Also, various systems and methods of metering power which are known to those skilled in the art are used by commercial, industrial, and residential customers of power utility companies. These power metering systems, however, generally only measure the amount of power used by the customer and record the usage for reading at a later time by the utility power company supplying the power to the customer. A revenue accuracy meter is an example of such a metering system conventionally positioned at a customer site to receive and measure the amount of power consumed by the customer during predetermined time periods during a day.

Conventionally, electric power is delivered to industrial, commercial, and residential customers by local or regional utility companies through the secondary power distribution system to revenue accuracy type electricity meters as an alternating current ("AC") voltage that approximates a sine wave over a time period and normally flows through customer premises as an AC current that also approximates a sine wave over a time period. The term "alternating waveform" generally describes any symmetrical waveform, including square, sawtooth, triangular, and sinusoidal waves, whose polarity varies regularly with time. The term "AC" (i.e., alternating current), however, almost always means that the current is produced from the application of a sinusoidal voltage, i.e., AC voltage.

In an AC power distribution system, the expected frequency of voltage or current, e.g., 50 Hertz ("Hz"), 60 Hz, or 400 Hz, is conventionally referred to as the "fundamental" frequency, regardless of the actual spectral amplitude peak. Integer multiples of this fundamental frequency are usually referred to as harmonic frequencies, and spectral amplitude peaks at frequencies below the fundamental are often referred to as "sub-harmonics," regardless of their ratio relationship to the fundamental.

Various distribution system and environmental factors, however, can distort the voltage waveform of the fundamental frequency, i.e., harmonic distortion, and can further cause spikes, surges, or sags, and other disturbances such as transients, time voltage variations, voltage imbalances, voltage fluctuations and power frequency variations. Such events are often referred to in the art and will be referred to herein as power quality disturbances, or simply disturbances. Power quality disturbances can greatly affect the quality of power received by the power customer at its facility or residence.

These revenue accuracy metering systems have been developed to provide improved techniques for accurately measuring the amount of power used by the customer so that the customer is charged an appropriate amount and so that the utility company receives appropriate compensation for the power delivered and used by the customer. Examples of such metering systems may be seen in U.S. Pat. No. 5,300,924 by McEachern et al. titled "Harmonic Measuring Instrument For AC Power Systems With A Time-Based Threshold Means" and U.S. Pat. No. 5,307,009 by McEachern et al. titled "Harmonic-Adjusted Watt-Hour Meter."

These conventional revenue accuracy type metering systems, however, have failed to provide information about the quality of the power received by a power customer at a particular customer site. Power quality information may include the frequency and duration of power quality disturbances in the power delivered to the customer site. As utility companies become more and more deregulated, these companies will likely be competing more aggressively for power customers, particularly heavy power users, and therefore information regarding the quality of the power received by the power customer is likely to be important.

For example, one competitive advantage that some utility companies may have over their competitors could be that their customers experience relatively few power quality disturbances. Similarly, one company may promote the fact that it has fewer times during a month that power surges reach the customer causing potential computer systems outages at the customer site. Another company may promote that it has fewer times during a month when the voltage level delivered to the customer is not within predetermined ranges which may be detrimental to electromagnetic devices such as motors or relays. Previous systems for measuring quality of power in general, however, are expensive, are bulky, require special set up and are not integrated into or with a revenue accuracy meter. Without a revenue accuracy metering system that measures the quality of the power supplied to and received by the customer, however, comparisons of the quality of power provided by different suppliers cannot readily be made.

One solution to the above described problems is proposed by U.S. Pat. No. 5,627,759 to Bearden et al. (hereinafter the "Bearden patent"), which is assigned to the assignee of the present invention and incorporated herein by reference. The Bearden patent describes a revenue accurate meter that is also operable to, among other things, detect power quality events, such as a power surge or sag, and then report the detection of the power quality event to a utility or supplier.

One of the useful features of the meter disclosed in the Bearden patent is waveform capture. The meter of the Bearden patent is operable to obtain waveform information regarding the voltage and/or current waveform at about the time a power quality event is detected. Such a feature is advantageous because the captured waveform may be analyzed to help determine potential causes of the event, the severity of the event, or other pertinent data.

One use of meters that have the waveform capture capabilities of the Bearden patent is to analyze the waveforms of several such meters after a power quality event to determine the performance of a certain portion of the network at the time of the power quality event. For example, if a power swell occurs over a portion of the power distribution system, then the utility may obtain captured waveforms from various meters on that portion of the network. The utility may then obtain information on how the power swell propagated through the network, as well as other information, by comparing the waveforms from the various meters.

One difficulty of performing analysis on the captured waveforms of several meters is temporally aligning the captured waveforms. In particular, to benefit from comparing the waveforms from several meters after a power quality event, it is important to temporally align or synchronize the captured waveforms. However, commonly used electronic clocks in electronic meters are not highly synchronized to each other, or in fact, to any external equipment. In the past, clock circuits within revenue meters have been calibrated periodically using the line voltage signal, which oscillates at 60 Hz. While such a practice increases the accuracy of the meter clock circuits, it cannot provide several dispersed meters with sufficiently accurate synchronization to produce reliable comparative waveform analysis.

What is needed, therefore, is a power measurement device which is coupled with a revenue accurate meter having a mechanism for synchronizing its internal clock with the clocks of one or more like meters and/or utility equipment.

SUMMARY OF THE INVENTION

The present invention addresses the above needs, as well as others, by providing a source of externally-generated precision time standard information within a revenue accurate meter. The time standard information, may, for example, be obtained from a global position satellite (GPS) generated time standard, a WWV time standard, or an IRIG-type time standard. A meter having such a source of externally-generated precision time standard information could then have its internal clock highly synchronized with other equipment, regardless of the location of such equipment.

An exemplary apparatus according to the present invention includes an electrical energy meter having a voltage digitizing circuit, a current digitizing circuit, a metering circuit, a clock circuit, and a source of externally-generated time standard information. The voltage digitizing circuit is operable to obtain analog line voltage information and generated digital line voltage information therefrom. Similarly, the current digitizing circuit is operable to obtain analog line current information and generate digital line current information therefrom. The metering circuit is operable to receive the digital line voltage information and the digital line current information and generate metering information therefrom. The clock circuit is operable to generate calendar/clock information, said clock circuit having a calibration input for receiving precision time calibration information. The source of externally-generated time standard information is operably coupled to provide precision time calibration information to the calibration input of the clock circuit.

The exemplary apparatus described above may further optionally include waveform capture functionality. Such a device could then capture waveforms and associate clock/calendar information with the captured waveform, wherein the clock/calendar information is calibrated to the externally generated time standard. If several such devices are incorporated into a power distribution network, the waveforms captured by several such devices would be highly synchronized to each other, thereby allowing analysis of the distribution network performance in the event of a power quality event.

The above features and advantages, as well as others, will become more readily apparent to those of ordinary skill in the art by reference to the following detailed description and accompanying drawings.

BRIEF DESCRIPTION OF THE DRAWINGS

FIGS. 1A and 1B schematically illustrate an environmental view of a revenue accuracy meter having power quality measurement according to the present invention;

FIGS. 2A and 2B schematically illustrate a revenue accuracy meter having power quality measurement arranged in communication with a power generator and a power customer according to the present invention;

DETAILED DESCRIPTION

The present invention will now be described more fully hereinafter with reference to the accompanying drawings in which preferred embodiments of the invention are shown. This invention may, however, be embodied in many different forms and should not be construed as limited to the illustrated embodiments set forth herein; rather, these embodiments are provided so that this disclosure will be thorough and complete and will fully convey the scope of the invention to those skilled in the art. Like numbers refer to like elements throughout.

Figure 1B:
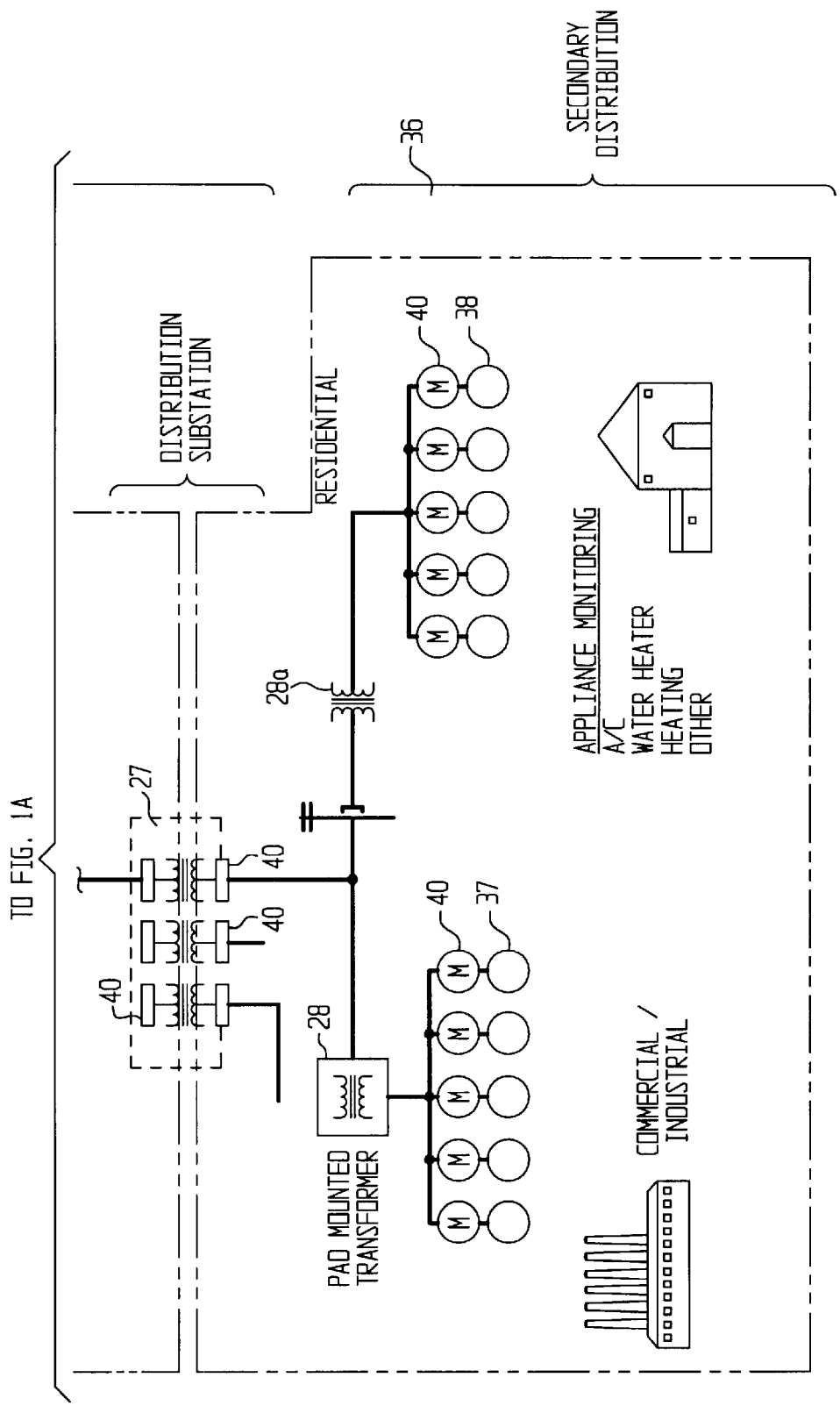

As illustrated in the schematic environmental view of FIGS. 1A and 1B, utility power distribution 20 generally starts with generation of the power by a power generation facility 21, i.e., power generator or power plant. The power generator 21 supplies power through step-up subtransmission transformers 21b to transmission stations 23. To reduce power transportation losses, the step-up transformers 21b increase the voltage and reduce the current. The actual transmission line voltage conventionally depends on the distance between the subtransmission transformers 21b and the users or customers, i.e., commercial, industrial, or residential 37, 38. Distribution substation transformers 25, 26, 27 reduce the voltage from transmission line level generally to a range of about 2–35 kilo-volts ("kV"). The primary power distribution system 31 delivers power to distribution transformers 28, 28a that reduce the voltage still further, i.e., about 120 V to 600 V.

Conventionally, power utility companies and suppliers have developed systems to analyze and manage power generated and power to be delivered to the transmission lines in the primary power distribution system 31, e.g., primarily through supervisory control and data acquisition ("SCADA") at a remote operations center 22 such as illustrated. These operation centers 22 generally communicate with the generation facilities 21 and the substations 24, 25 through conventional data communication terminals 21a, 24a, 25a. Because problems currently arise in the secondary power distribution system 36, i.e., from the distribution substation to the customers, with respect to analyzing power that is delivered to the industrial, commercial, or residential customer sites through the secondary power distribution system 36, a revenue accuracy meter 40, or a plurality of revenue accuracy meters 40 is provided having power quality measurement according to the present invention and preferably is positioned as illustrated (FIGS. 1A–1B) in the secondary power distribution system 36 to provide a remote terminal or node in the overall system 20 for troubleshooting or diagnosing problems, identifying emergency situations, and systematically analyzing information from specific customer sites.

Due to the deregulation of the power delivery industry and the consequent brokering of power at the transmission level, it is also advantageous to implement revenue accurate meters 40 having power quality measurement according to the present invention within the transmission system 31 and/or generation system 21.

FIGS. 2A, 2B, 3, and 4 schematically illustrate a revenue accuracy meter 40 having power quality measurement arranged in communication with a power generator 80 such as a utility power company and a power customer 60 according to the present invention. A revenue accuracy meter 40 according to the present invention is an electricity meter or an alternating current static watt-hour meter used for billing functions, i.e., billing meter. These revenue power or electricity meters preferably are solid state meters that at least meet American National Standards Institute ("ANSI") 12.16, International Electrotechnical Commission ("IEC") 687/1036 standard, similar improved or revised standards, or the like, as understood by those skilled in the art. As illustrated, the revenue accuracy meter 40 for measuring the amount and quality of electrical power received by a power customer 60 preferably has a housing 40a and a communications interface which preferably includes a plurality of data communication ports 41, 42, 43, 44 positioned in the housing 40a (see FIGS. 3 and 4A). The housing 40a is configured as is well known in the art to connect the meter 40 to the power lines through, for example, a meter socket.

Although four data communication ports 41, 42, 43, 44 are illustrated, a revenue accuracy meter 40 according to the present invention preferably has at least two data communications ports. At least one of the plurality of data communication ports 41, 42, 43, 44 is arranged for data communications with a power customer 60, e.g., a power customer port 41, and at least one of the plurality of data communication ports 41, 42, 43, 44 is arranged for data communications with a power generator, e.g., power generator ports 42, 43, 44.

The particular embodiment of the ports 41, 42, 43, 44 illustrated, however, advantageously provides real time data communications with a plurality of the various groups or departments of a utility company 80 such as marketing 82, operations 83, engineering 84, and/or billing/finance 85 (FIG. 2B). For example, power quality data such as that discussed below in connection with FIGS. 6, 7A, 7B, and 7C may be utilized by the customer service or the marketing group 82 receiving data from a revenue accuracy meter 40 according to the present invention by monitoring power outage, sags/surges, and excessive harmonics. This information can then be relayed, i.e., by sequential calls, to a head office, key account representatives, and/or customers 60. Such power quality data may be utilized by operations 83 to monitor voltage/current, KW/KVAR, disturbances, and/or harmonics received by customers 60 through the meter 40 and to monitor transformers, i.e., temperature, capacitors, and other control functions in the power distribution system 20.

The engineering group or department, for example, may utilize the meter 40 and the data received therefrom for monitoring total harmonic distortion, for captured waveform analysis, for spectral analysis, as well as studying and analyzing outages and sags/surges from a diagnostic approach. The billing or finance group 85, in turn, may conduct load or rate research based upon information provided from the meter 40 about power quality and power usage. As understood by those skilled in the art, the billing group 85 of the power generator 80, for example, can conduct TOU metering, real-time pricing, transformer loss, compensation, load profile, meter installation integrity, meter wiring verification, load curtailment, and/or various other functions. Also, these various groups of the power generator 80 can also responsively interact with the substation controller 86 such as in multi-drop meter applications or to communicate with remote terminal units ("RTUs"), printers, or the like. Further, the power generator 80 can provide various auxiliary inputs to the meter 40 such as transformer oil temperature data, feeder subloads, redundant metering data, status alarms, pressure data, and/or other information as desired.

Figure 2A:
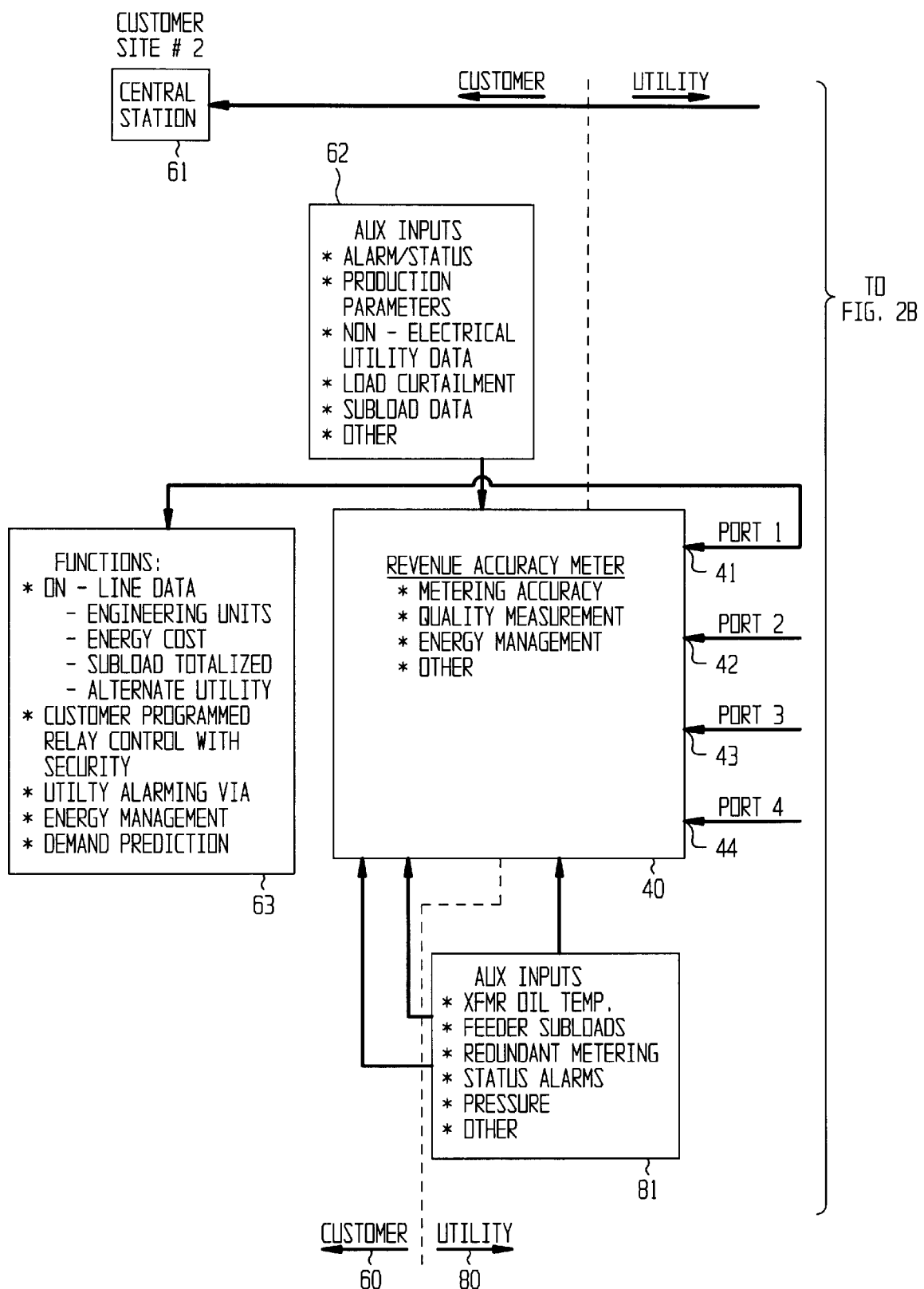
Figure 8:
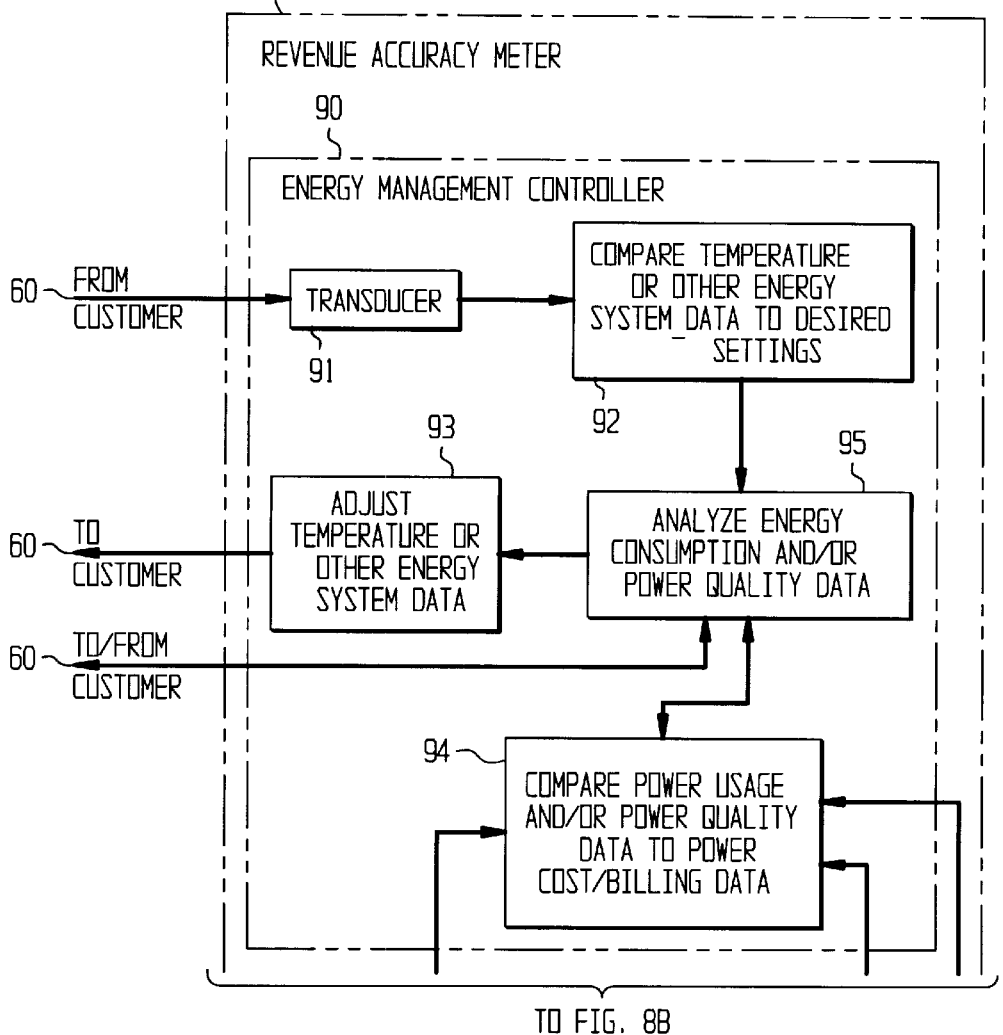
FIG. 8 schematically illustrates a revenue accuracy meter having power quality measurement and energy management according to a second embodiment of the present invention.

The customer, on the other hand, can receive on-line data such as engineering units, energy cost, subload data, alternate utility data, and other totals or specific information as needed. Preferably the meter 40 also has customer programmed relay control with security, utility alarming, demand prediction, and energy management capabilities. Additionally, as also illustrated in FIGS. 2A and 8A, a revenue accuracy meter 40 according to the present invention further has an energy management controller 90 electrically connected to the second receiver and the second transmitter for controlling power usage responsive to predetermined command signals received from the power customer through the power customer port of the communications interface. Likewise, the customer may provide auxiliary inputs 62 to the meter 40 such as alarms, status, production parameters, non-electrical utility data, load curtailment data, subload data, as well as other data as desired. The meter 40 may also be monitored or utilized by the customer at a customer central station 61 as illustrated. The data communication ports also provide inter or intra-customer communication, i.e., customer to utility or other customer and communication within customer facility or locations.

Either separate from the energy management controller 90 or in conjunction therewith, a meter 40 according to the invention preferably further has an access restricter, not shown, coupled in electrical communication with the power generator port for providing restricted access between the power customer port and the power generator port. This security access preferably is resident in one of the controllers of the meter 40. This access restriction means or access restricter preferably is software programmed as understood by those skilled in the art so that access is provided to either the power customer or the power generator by a command signal representative of a user password or a data access key. This, in turn, provides a wall for security between meter functions used by a customer 60 and meter functions used by a power generator or other third party 80.

Although, as understood by those skilled in the art, the communication interface of a revenue accuracy meter 40 may include any means for communicating data to and from the meter 40, such as using a probing device, an optical device, or a remote device for interfacing with the meter 40, the communications interface of a revenue accuracy meter 40 preferably includes one or more transceivers, e.g., universal asynchronous receiver/transmitter ("UART"), positioned within the housing 40a of the meter 40 and arranged to receive and transmit data signals through the data communication ports 41, 42, 43, 44.

Figure 3:
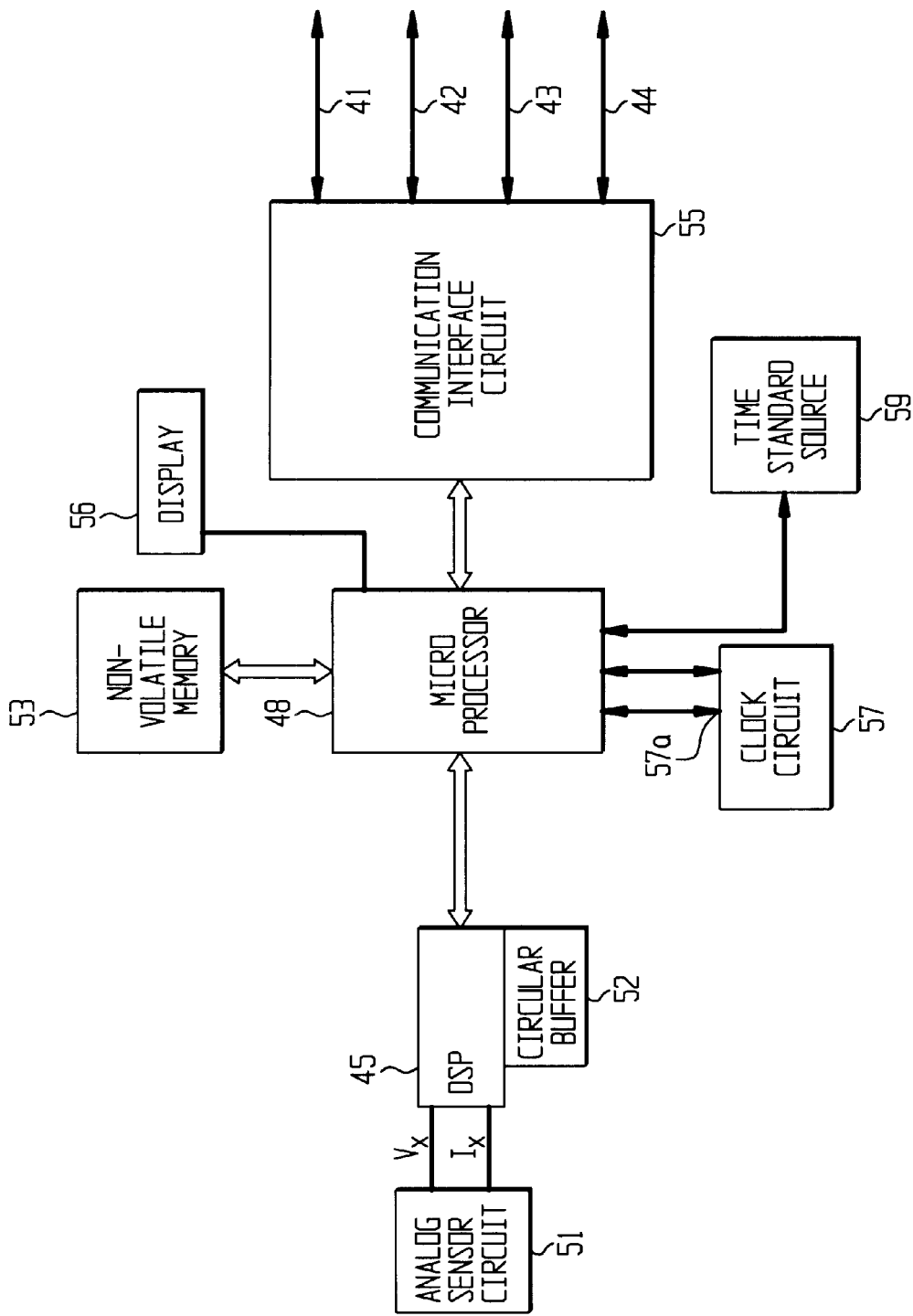
FIG. 3 schematically illustrates a revenue accuracy meter having power quality measurement arranged in communication with various data communication links according to the present invention.

Referring now to FIG. 3 in particular, the exemplary embodiment of the meter 40 includes an analog sensor circuit 51, a digital signal processing circuit 45, a circular buffer 52, a microprocessor 48, a non-volatile memory 53, a time standard source 54, a communication interface circuit 55, a display 56, a clock circuit 57 and the ports 41, 42, 43 and 44.

The analog sensor circuit 51 is a circuit that connects to the utility power lines and is operable to generate signals including analog line voltage information and analog line current information for each of the phases in a polyphase power system. In the exemplary embodiment described herein, the analog sensor circuit 51 is operable to obtain analog line voltage information, VA, VB and VC, and analog line current information, IA, IB and IC for three phases of a three phase electrical system. To this end, the analog sensor circuit may suitably include voltage divider circuits, current shunts, current transformers, embedded coils, and/or other well known voltage and current multiple outputs sensing technology.

The digital signal processing ("DSP") circuit 45 and the microprocessor 48 together comprise a metering circuit that is operable to receive line voltage and line current information from the analog sensor circuit 51 and generate metering information therefrom. In particular, the DSP circuit 45, in addition to a DSP, includes one or more analog to digital signal converters that receive the analog line voltage information and analog line current information and generate digital line voltage information and digital line current information therefrom. The DSP circuit 45 and microprocessor 48 are furthermore suitably programmed to receive the digital line current information and digital line voltage information from the analog to digital converters and generate metering information therefrom. The metering information includes watts, VAR and VA quantities representative of energy consumed by the customer. Further detail regarding the operation of the metering circuit is described below in connection with FIGS. 5A and 5B.

The DSP circuit 45 and the microprocessor 48 also together comprise a power quality circuit operable to capture waveforms in accordance with the present invention. Further detail regarding the operation of the power quality circuit is described below in connection with FIGS. 6, 7A, 7B, and 7C.

It will be noted that the architecture of the metering circuit and power quality circuit describe above is given by way of example only. Those of ordinary skill in the art may readily devise alternative architectures that incorporate the principles of the metering circuit and power quality circuit described herein. For example, the use of a combination of a DSP circuit and a microprocessor as the metering circuit and power quality circuit is given by way of example only. A single processor may suitably be used for either or both of such circuits. Such a single processor may require relatively high processing speeds to accomplish revenue quality metering and therefore may not be as cost effective as the architecture discussed herein. Alternatively, those of ordinary skill in the art may employ metering circuits and/or power quality circuits according to the present invention that incorporate three or more processors, or that incorporate different types of controllers and processors. Such architectures would provide at least some of the advantages of the present invention.

The power quality circuit of the meter 40 further includes the circular buffer 52. The circular buffer 52 is a circuitous memory structure within at least a portion of a memory device, preferably RAM. The circuitous memory structure stores digital line voltage and/or digital line current values in the sequence in which they are received. Once the circular buffer 52 is full, each new value entered replaces the oldest value in the buffer. In the present invention, the circular buffer 52 may suitably be an allocated portion of the internal RAM of the DSP circuit 45. However, the circular buffer 52 may alternatively comprise an external RAM or even RAM that is internally or externally coupled to the microprocessor 48.

Returning to the exemplary embodiment of the meter 40 illustrated in FIG. 3, the non-volatile memory 53 may suitably be a flash memory non-volatile RAM, EEPROM, or other non-volatile memory. Non-volatile RAM and flash memory are preferable because the footprint of such memories per unit of memory is significantly smaller than the footprint of EEPROM. However, EEPROM can be advantageous when battery back-up or other back up power sources are impractical or unreliable. Preferably, the non-volatile memory 53 has 4 to 8 megabytes of memory.

The time standard source 54 is a source of externally-generated precision time standard information. For example, the time standard source 54 may suitably be a GPS receiver operable to obtain precision time standard information via satellite. Alternatively, the time standard source may be an IRIG or WWV time standard receiver. An example of a time standard source that may be incorporated into the meter 40 is the model GPS-PCI card available from TrueTime, Inc.

The clock circuit 57 is a circuit well-known in the art that is operable to generate clock/calendar information in an ongoing manner. In general, the clock circuit 57 may suitably include a crystal oscillator circuit and appropriate logic gates and counters for generating clock/calendar information based on the crystal oscillator circuit. Such circuits are well known. The clock circuit 57 is coupled to the microprocessor to provide the clock/calendar information thereto. The clock circuit 57 also has a calibration input 57a that is operably connected, through the microprocessor 48, to receive the externally generated precision time information from the time standard source 54. The clock circuit 57 is operable to adjust its clock/calendar information based on the received externally generated precision time information. In accordance with the exemplary embodiment described herein, the time standard source 54 provides precision time information in the form of pulse, i.e. one pulse per second. Thus, the clock circuit 67 is "recalibrated" each time it receives a pulse.

It will be noted that in some clock circuits, the calibration input may suitably be the connection through which clock/calendar information is provided to the microprocessor 48. Moreover, it will be understood that the clock circuit 57 may be integrally formed with the microprocessor 48.

The display 56 is an LCD or other display circuit operable to display data provided by the microprocessor 48. The display 56 and/or the microprocessor 48 includes any necessary drivers for converting the microprocessor data into signals that cause the LCD or other display medium to display the information contained in the data. Such circuits are well known.

The communication interface circuit 55 cooperates with the communication ports 41, 42, 43, and 44 to effectuate communication between the meter 40, through the microprocessor 48, and external devices, including remotely located external devices. To this end, the communication interface circuit 55 may include one or more additional processors that assist in providing such communications.

The ports 41, 42, 43 and 44 preferably include an RS-232 interface port and/or a 20 milliampere ("mA") current loop, an optical port, and two of either an internal modem, a direct interface, a protocol converter, or an RS-485 port. The internal modem is arranged for communicating with utility customer or power customer auxiliary inputs and outputs. The direct interface ("I/F") is arranged to connect to an external modem which may provide either additional or duplicative data to the processors 45, 48. The protocol converter and the RS-485 port are likewise arranged to provide data communication to the operations center 22 (see FIG. 1) as well as the local area network ("LAN") of the utility company or industrial consumer. The optical port preferably is arranged for data communication through a power generator port to laptop computers or the like. The current loop provides secure data communication and, preferably, is arranged for data communication with the auxiliary inputs 81, 85 from the utility 80, such as an encoder, printer, RTU, various software or hardware tools, personal computer, remote data display, or the like. The external modem and the LAN are connected in electrical communication with the desired group 82, 83, 84, 86 of the utility or power generator 80 as illustrated.

Figure 4:
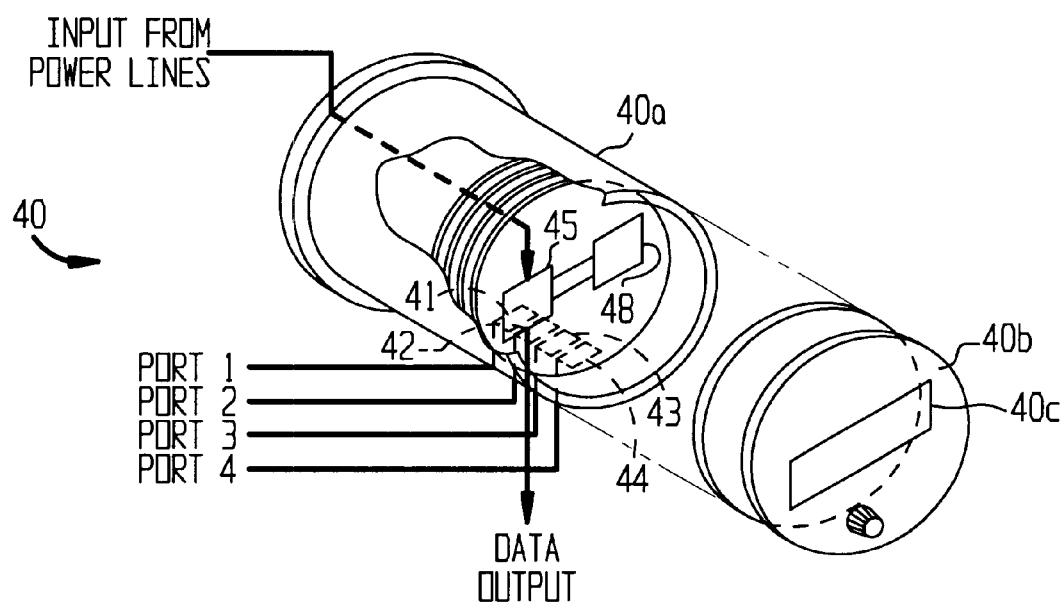
FIG. 4 illustrates a revenue accuracy meter having power quality measurement according to the present invention.

The elements of the meter 40 described above of FIG. 3 are advantageously configured to reside within a single housing that is operable to be mounted on select ones of standard meter sockets, as illustrated in FIG. 4.

Figure 5A:
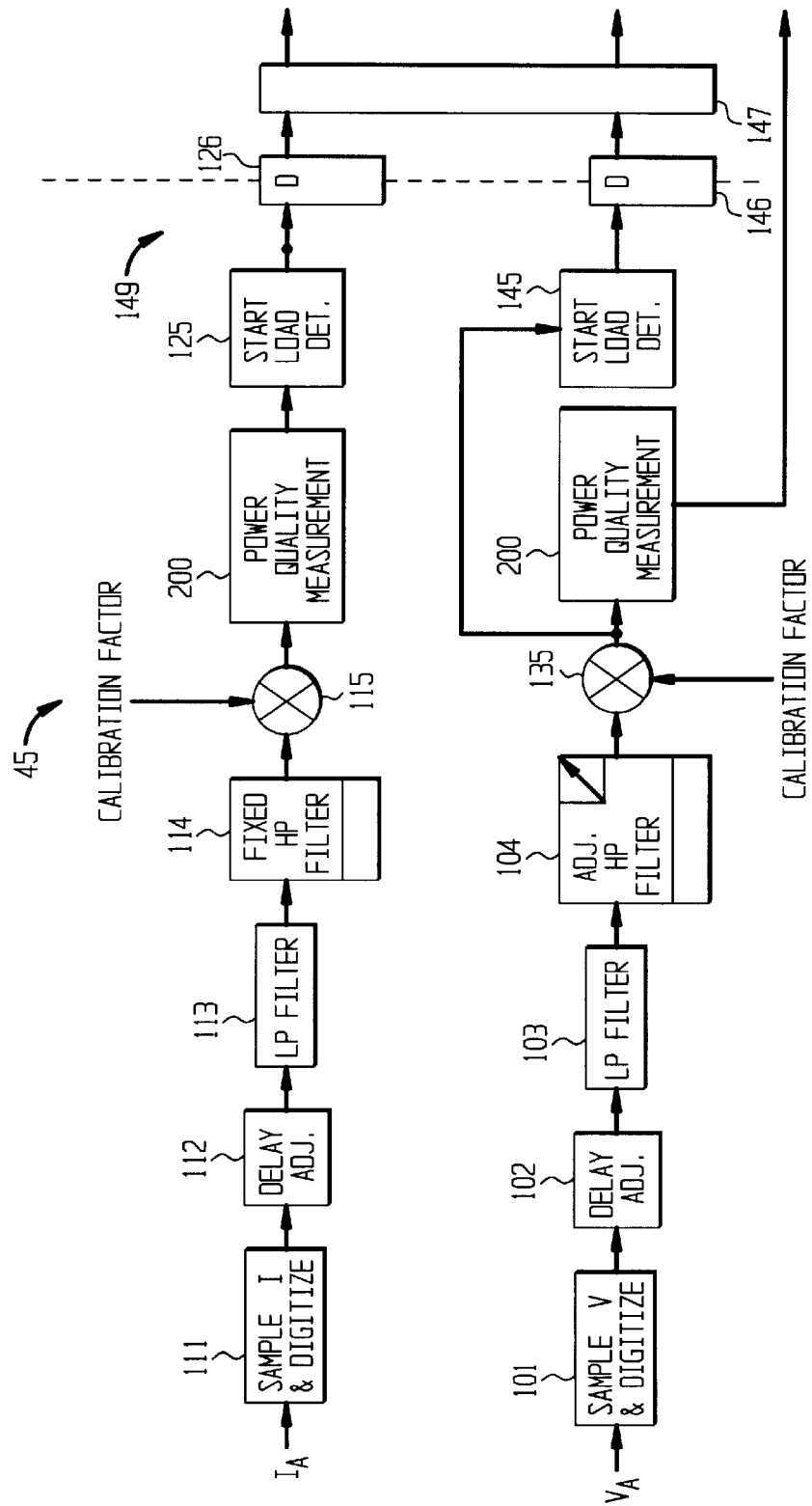
FIGS. 5A and 5B schematically illustrate a flow chart of a digital signal processor circuit of a revenue accuracy meter having power quality measurement according to the present invention.
Figure 5B:
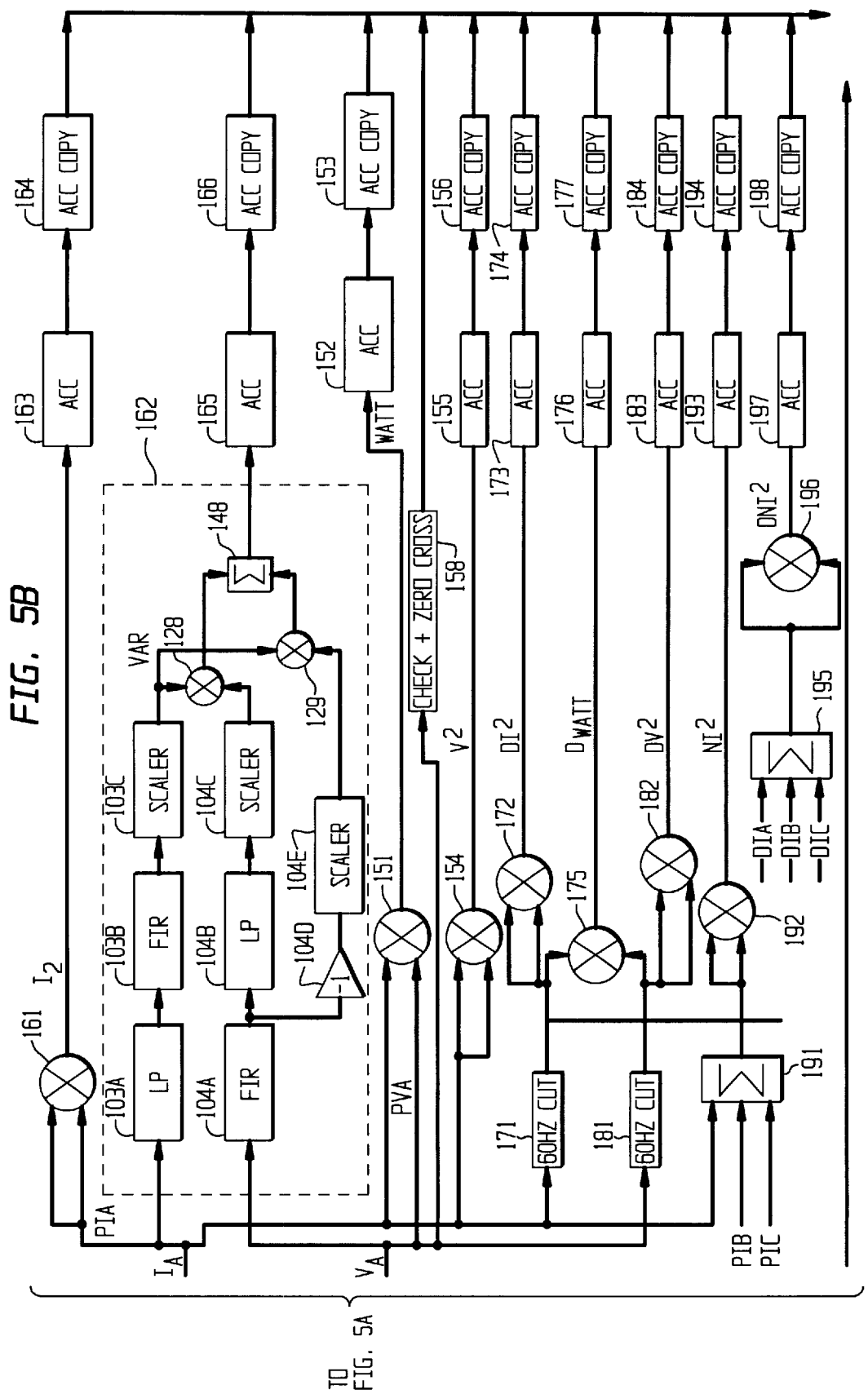

FIGS. 5A and 5B show in further detail the operation of the metering circuit and the power quality circuit of the meter 40 of FIG. 3. In particular, the DSP circuit 45 portion of the metering circuit and power quality circuit is shown in detail in FIGS. 5A and 5B. In general, the DSP circuit 45 receives the analog line voltage information and analog line current information and performs the preliminary metering calculations as well as preliminary power quality determinations as described herebelow. With respect to metering calculations, the DSP circuit 45 samples and processes the analog line voltage and current signals using high computational speeds and generates interim values such as accumulated watts, VA, and VAR values. By way of example, the DSP circuit 45 samples each line voltage and line current signal 32 times per second. This sampling rate, combined with the use of 20 bit resolution samples, allows the meter 40 to perform revenue accurate metering measurements.

The microprocessor 48 periodically retrieves the accumulated interim values and uses them to generate standard meter energy pulses. The microprocessor 48 also accumulates various energy consumption values in compliance with metering standards. The microprocessor 48 further operates to cause display of certain metering values and/or communication of metering values to the consumer or the utility.

The DSP circuit 45 further employs the sampled or digitized line voltage signals, and in some cases the digitized line current samples, to determine the presence of undesired variations in the electrical signal representative of power received by a power customer 60 across electrical power lines or the like such as spikes, surges, sags, harmonic distortion, and/or other disturbances. The variation determining means preferably is a variation determiner, or other power quality circuit 200, as illustrated coupled in electrical communication with the receiver for determining frequency, i.e., time periods or time occurrences, and duration of undesired variations in the received voltage signal during a plurality of predetermined time periods. These undesired signal variations are preferably minimum or maximum threshold variations and/or timing frequency variations of the supplied signal. The operation of the power quality circuit is discussed in further detail in connection with FIG. 6.

Once an undesired signal variation is detected, information is passed to the microprocessor 48 which controls the communication and/or storage of information regarding the variation, including waveform capture in accordance with the present invention, as described below in connection with FIGS. 7A, 7B and 7C.

As best illustrated in FIGS. 5A and 5B, the DSP circuit 45 receives analog line voltage information VX and analog line current information IX which is representative of the power received by a power customer on one phase of a polyphase system. In a three phase system, the DSP circuit 45 receives the line current information and line voltage information of each phase in sequential manner. To this end, the analog line current and analog line voltage information is multiplexed so that only one line voltage VX and only one line current IX is received at any particular instant. It will be noted that in the alternative, the circuit shown in FIG. 5A may suitably be duplicated for each of the phases of the system.

In any event, the sample and digitize circuit 111, which is preferably an A/D converter, converts IA to a digital line current signal. Likewise, the sample and digitize circuit 101, which is also preferably an A/D converter, converts VA to a digital line voltage signal. Time compensators 102, 112 then compensate for time skew in sampling due to multiplexing a single analog-to-digital converter. The time compensators 102, 112 may suitably be short FIR or smoothing filters with non-symmetrical coefficients to get the proper time skew with a reasonably flat frequency response.

Alternatively, time compensators 102, 112 may be omitted if simultaneously sampling A/D converters are used. In such a case, measurement alignment is achieved through synchronization of the A/D converters.

In any event, the compensated digital signals then are respectively received by low pass filters 103, 113. The digital line current signal passes through a fixed high pass filter 114 and the digital line voltage signal passes through an adjustable high pass filter 104. A calibration factor 115, 135 is then respectively applied to the filtered signals. After calibration, the digital line current signal and the digital line voltage signal is applied to the power quality circuit 200 of the meter 40 according to the present invention. As understood by those skilled in the art, the power quality circuit 200 preferably is in the form of software and/or hardware resident within or in electrical communication with the DSP circuit 45 and the microprocessor 48 of the present invention. FIGS. 6, 7A, 7B, and 7C illustrate the operations of the power quality circuit 200 in further detail.

Once the power quality circuit 200 receives the digital line current and digital line voltage information, the meter calculations are then preferably continued by initiating the start customer load detectors 125, 145. As understood by those skilled in the metering art, these detectors 125, 145 preferably assure that relatively very small signals, i.e., due to leakage current, register as zero usage. The signal then passes through delay adjustments 126, 146 to lower the sampling rate, e.g., through decimation. The delay adjustments preferably allow the normal power measurement process to run at a slower rate and therefore use less of the resources of the microprocessor 48 or DSP circuit 45. The signal passes to a system configuration block 147 to allow for special meter types such as a 2-½ wye meter.

As illustrated in FIG. 5B, the signal further passes through a filtering configuration 162 preferably such as illustrated. The current signal preferably is applied to a low pass filter 103A. This filter 103A produces a phase shift that approaches 90 degrees lag as the frequency of the amplitude signal increases. This filter 103A also produces an amplitude response that decreases with frequency, which is compensated by the two FIR filters 103B and 104A as illustrated. The output of the voltage FIR filter 104A is then applied to a low pass filter 104B. Because the VAR measurement preferably may require a 90 degree lag of voltage relative to current, as understood by those skilled in the art, and the current is lagged by 90 degrees already, an additional lag of 180 degrees is needed in the voltage. A signal inversion by an inverter 104D preferably supplies this lag. The output of multiplier 129 thus provides VARs with errors due to 103A only approaching 90 degrees. Multiplier 128 produces an error correction signal of the correct level and phase to correct the errors when summed in summer block 148.

The scalers 103C, 104C, and 104E preferably adjust signal levels so that watts and VARs have the same scale factors in the system 162. The outputs of multipliers 151, 154, 161, and 192 are therefore amperes squared, watts, volts squared, and neutral amps squared as measured by conventional metering. Multipliers 172, 175 and 182 preferably have their input 60 Hertz fundamental removed by filters 171 and 181 so that their outputs are the harmonic amperes squared, harmonic watts, and harmonic volts squared. As illustrated by FIG. 5B, multiplier 192 also has as its input the output of a 3-phase current summer 191. These values or quantities are then integrated in accumulators 152, 155, 163, 165, 173, 176, 183, 193, 197 and copied into buffers 153, 156, 164, 166, 174, 177, 184, 194, 198. In addition, the harmonic amperes for the three phases are summed and multiplied (Blocks 195, 196) to generate harmonic neutral current squared. The original signal prior to the filter is also checked at block 158. The zero cross signal from block 158 causes the accumulator copies 153, 156, 164, 166, 174, 177, 184, 194, 198 to have an integer number of cycles such as for stable short term readings.

The microprocessor 48 then periodically retrieves the values from the buffers 153, 156, 164, 166, 174, 177, 184, 194 and 198 and generates the metering quantities therefrom. In particular, the microprocessor 48 accumulates watts, VAs, VARs and performs other energy-related calculations known in the art. Once the values have been retrieved from the buffers, the buffers 153, 156, 164, 166, 174, 177, 184, 194, and 198 are cleared.

Figure 6:
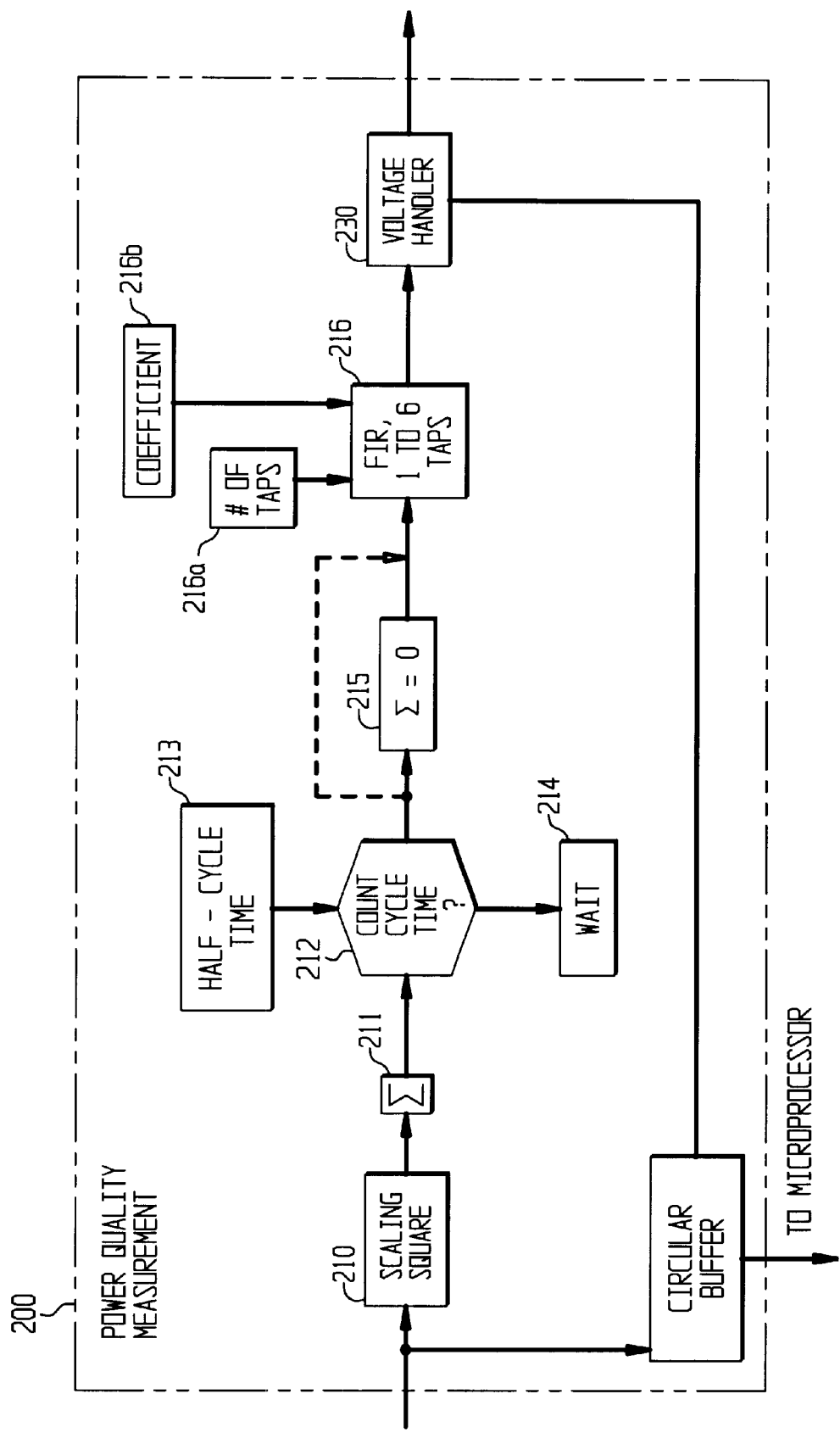
FIG. 6 schematically illustrates a power quality measurement circuit of a revenue accuracy meter according to the present invention.

FIG. 6 illustrates a power quality circuit 200 of the invention illustrated in the form of a variation determiner. The power quality circuit 200 at its input receives per phase digital line voltage information (and/or digital line current information) in the form of digital samples. It will be noted that the power quality circuit 200 segregates each phase such that each of the below operations is performed individually for each phase.

The digital samples are provided to both the circular buffer 52 and the scaler 210 of the variation determiner. In particular, each digital line voltage sample is provided to the circular buffer 52 prior to further processing within the variation determiner. The circular buffer 52 stores the most recent NN samples, where NN is a predetermined number, typically defined by an operator and programmed into the meter. Further detail regarding the programming of values into the meter 40 is discussed below in connection with FIG. 9. The circular buffer 52 therefore, at any time, contains digital line voltage information representative of the line voltage waveform for the most recent MM cycles, where MM=NN/(samples per cycle).

In an alternative embodiment, a data compression function may be introduced at the input of the circular buffer 52. The data compression function could be any suitable data compression algorithm and would reduce the amount of samples required to represent the waveform shape. The use of such a data compression function would thereby conserve memory space, albeit at the cost of processing power.

In any event, the scaler 210, which also receives the digital line voltage information, provides the scaled digital line voltage signal to a summation device 111. The scaler 210 preferably scales the size of the signal to assure against math overflows. The scaler 210 also preferably squares the signal so as to make the meter responsive to root mean square ("RMS") voltage. The scaled signal is then summed at the summation device 211. A voltage cycle time determiner 212 is coupled in electrical communication with the scaler and/or squarer 210, i.e., through the summation device 211, for determining voltage cycle time. Half-cycle timing 213 and waiting 214 periods are preferably for synchronizing or zeroing the sum 215 of the timing of the system 200. Accumulation preferably occurs for one-half cycle, passes the result to an FIR filter 216, then clears the accumulator, i.e., S=0.

The multiple tap FIR filter 216, i.e., preferably includes 1–6 taps, and is coupled in electrical communication with the cycle time determiner 212 for smoothing and/or filtering the voltage squared signal. The number 216a and the coefficients 216b =*1 for the taps are input into the FIR signal* smoothing device 216. It will also be understood that the electrical signals as illustrated in FIGS. 6–7C of the power quality circuit 200 are illustrative for the voltage signals, but under appropriate current signal characterization parameters may also include the current signals.

The output of the FIR signal smoothing device 216 is then provided to a voltage handler 230. The voltage handler 230 is the block that compares the resultant value with expected values to determine if a line voltage variation is present. More importantly, the voltage handler 230O determines whether a detected line voltage variation exceeds one or more variation thresholds and causes waveform capture in accordance with the present invention. In addition, once such a variation is detected, the voltage handler 230 subsequently determines when the variation reduces to a point where it no longer exceeds one or more thresholds and causes further waveform capture in accordance with the present invention. To this end, the voltage handler 230O in the exemplary embodiment described herein operates as described below in connection with FIGS. 7A, 7B, and 7C.

Figure 7A:
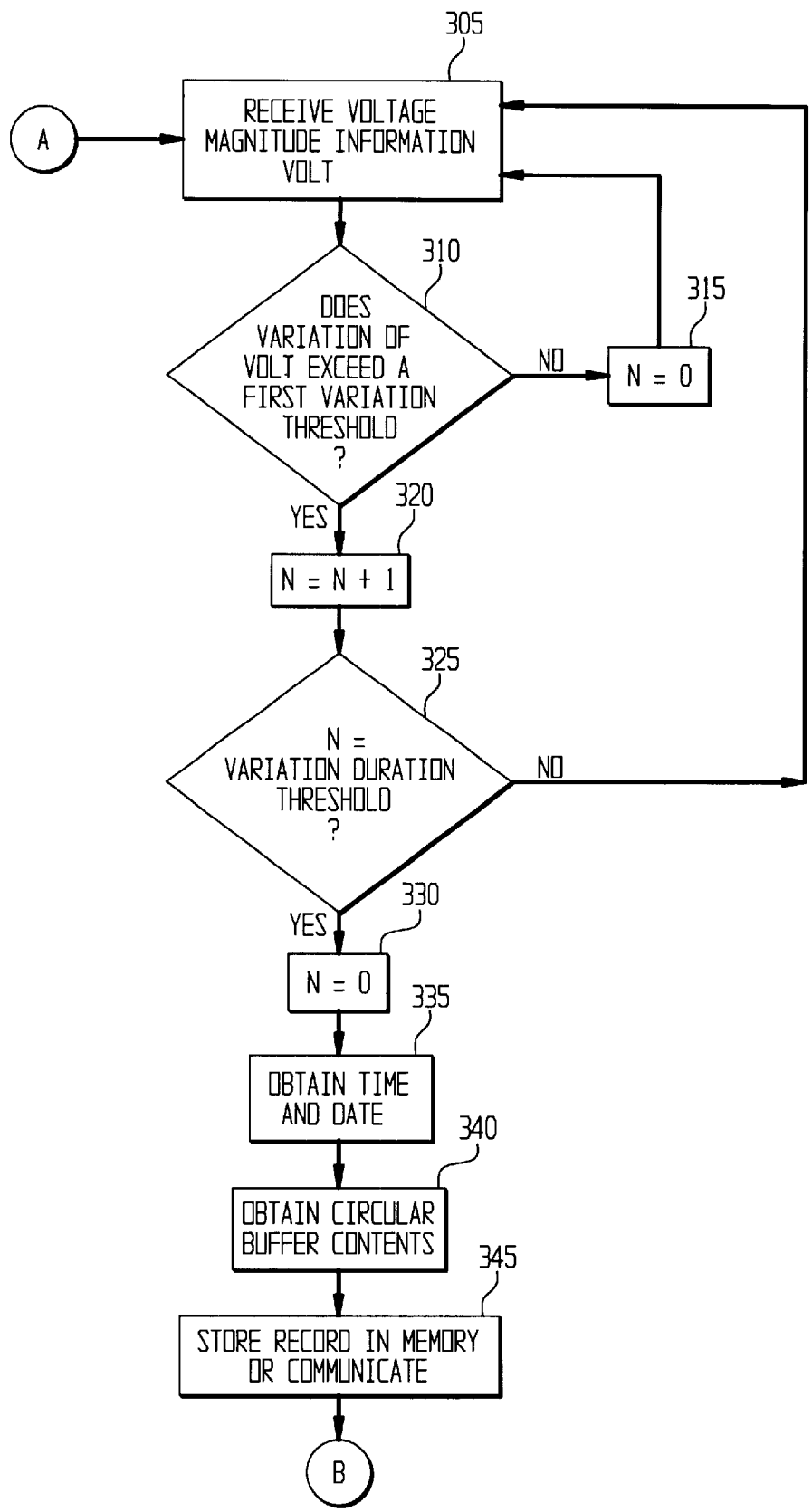
FIGS. 7A, 7B, and 7C illustrates the operations of a power quality circuit within the revenue accuracy meter of FIG. 3 in accordance with the present invention.
Figure 7B:
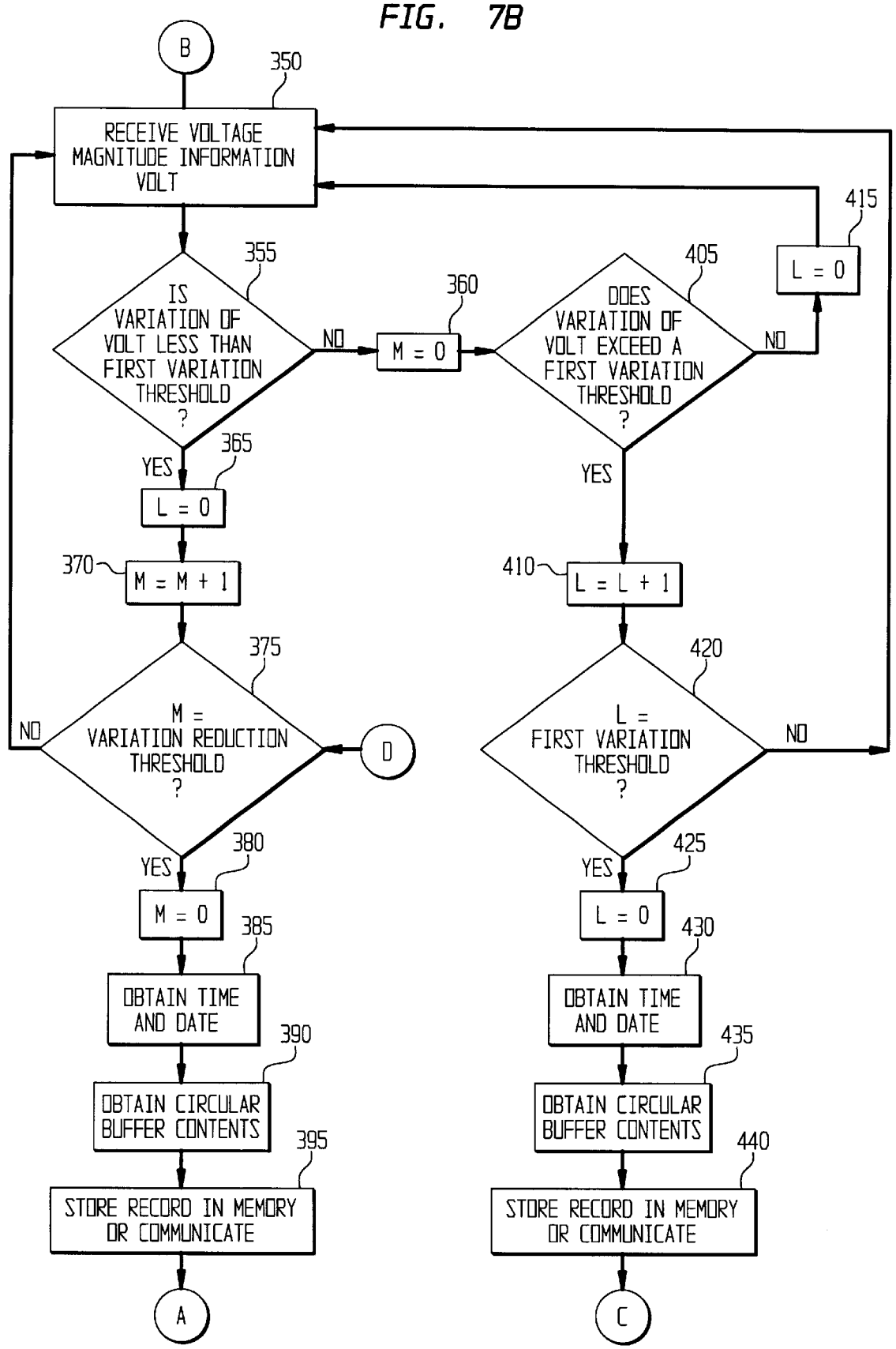
Figure 7C:
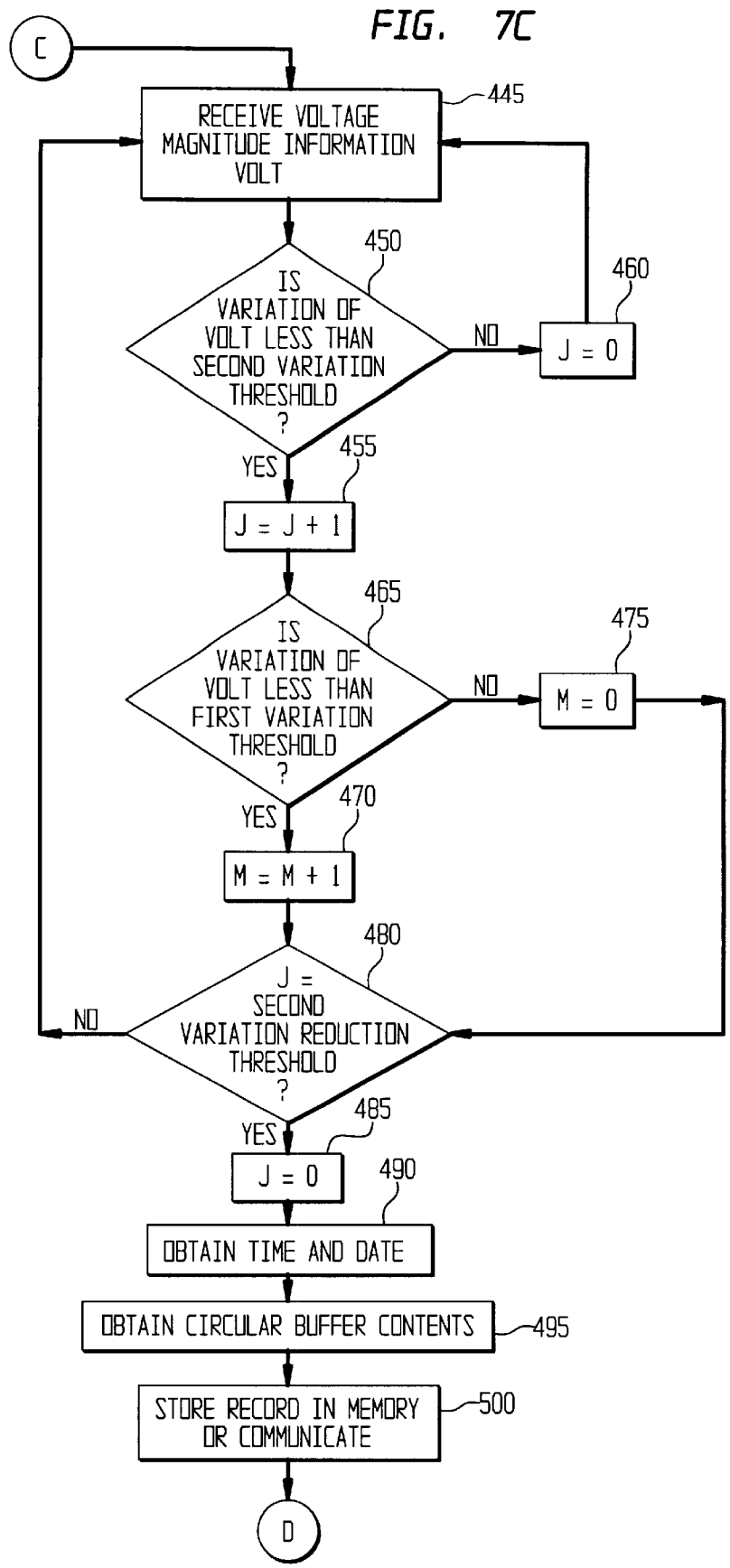

The flow diagram illustrated in FIGS. 7A, 7B, and 7C illustrate the steps of the variation detection and waveform capture operations of the exemplary embodiment of the present invention. It is noted that the most of the operation of the voltage handler 230 as illustrated in FIGS. 7A, 7B, and 7C is preferably carried out in the DSP circuit 45, which is designed to readily handle calculations at the sample rate required for the revenue accurate metering circuit operation. However, because the operations of the voltage handler 230 in the present embodiment require the voltage measure for an entire half cycle, the operations are suitably slow enough to be carried out by the microprocessor 48 if desired. In some cases, it may be preferable to have a combination of the DSP circuit 45 and the microprocessor 48 carry out the operations of the voltage handler 230.

In any event, referring to FIG. 7A, the voltage handler 230 first receives the voltage magnitude information, represented herein as the value VOLT, from the FIR smoothing circuit 216 (step 305). The voltage handler 230 then determines whether the variation of VOLT from an expected value exceeds a first variation threshold (step 310). If so, then the voltage handler 230 proceeds to step 320. If not, however, then the voltage handler 230 proceeds to step 315.

In particular, in step 310, the voltage handler 230 compares VOLT to a set point level, which may be a high set point level or a low set point level. The high set point level represents a voltage magnitude level (in the same units as VOLT) above which a potential waveform capture event is identified. Typically, the high set point level corresponds to a voltage level that, if maintained for several half-cycles, indicates a power quality event. Likewise, a low set point level represents a voltage magnitude level below which a potential waveform capture event (i.e. power quality event) is identified. Thus, for example, if the nominal or expected line voltage level is 120 volts, then a low set point level may be set to correspond to a detected line voltage of 90 volts. Set point levels may either be preset or programmed into the meter 40 by the programming device 600 discussed below in connection with FIG. 9.

In the preferred embodiment discussed herein, the programming device 600 may be used to set multiple points both for high set points and low set points. The second set point may suitably identify a sub-event within a power quality event, such as a further voltage sag, that occurs within a power quality event identified by the first set point. Accordingly, it can be seen that several layers of set points, both below the expected line voltage level and above the expected line voltage level may be employed.

In any event, if the variation of VOLT exceeds the first variation threshold (or in other words, VOLT is greater than a first high set point or less than a first low set point), then an index of consecutive variations N is incremented (step 320). If, however, the variation of VOLT does not exceed the first variation threshold, then the index N is reset to zero (step 315) and the voltage handler 230 returns to step 305 and proceeds accordingly with the next value received from the FIR smoothing filter 216.

Referring again to step 320, after the index N is incremented, the voltage handler 230 determines whether N exceeds a predetermined variation duration value (step 325). The variation duration value represents a minimum number of half-cycles that the variation of VOLT must exceed the first variation threshold to trigger the waveform capture. The predetermined value is set such that a spurious transient that is insignificant from a power quality standpoint will not trigger a waveform capture and other power quality event recording and reporting functions. To this end, the predetermined valve may be 2, 4, or 6 half-cycles. The predetermined value may suitably be set by an operator.

It will be noted that other techniques for distinguishing between spurious variations and real power quality events may be used. For example, FIGS. 7A, 7B, and 7C of U.S. Pat. No. 5,627,759 illustrate in further detail such a technique that may be incorporated into the meter 40 described herein.

In any event, if the voltage handler 230 determines that N does not exceed the predetermined variation duration value. then the voltage handler returns to step 305 to receive the next voltage magnitude value and proceed accordingly.

If, however, N exceeds the predetermined variation duration value, then the voltage handler resets N (step 330) and records the time and date of the power quality event (step 335). In particular, the time and date information provided by the clock circuit 57 is written immediately to a buffer signifying the detection of a waveform capture event.

The voltage handler 230 also retrieves the circular buffer contents. The circular buffer contents include the previous MM cycles worth of historical waveform sample data. The voltage handler 230 then forms a power quality event record. The power quality event record may suitably be a time value series data structure that includes the circular buffer contents and the time and date information.

The voltage handler 230 then writes the record to a memory and/or communicates the record to the utility customer or the utility generator or supplier (step 345). In particular, the voltage handler 230 may cause the record to be stored in either a memory that is inherent to either the DSP circuit 45 or the microprocessor 48, or an external memory, not shown. Such a memory may suitably be a random access memory or a sequentially accessed memory. However, it is preferable that at least some power quality event records be written to the non-volatile memory in order to preserve the data upon loss of power to the meter.

Thus, each time the line voltage magnitude exceeds the first variation threshold for N half-cycles, the buffer contents are recorded, or in other word, the line voltage (or line current) waveform is captured, by generation of the power quality event data record.

It is noted that it is also preferable to obtain data representative of several waveform cycles that occur after the power quality event is first detected in step 335. To this end, the voltage handler 230 may execute a subprocess in which the requisite number of additional line voltage samples are provided to the power quality event data record. The number of line voltage samples to be recorded after detection of a variation that exceeds the first variation threshold also is programmed into the meter 40 by an operator.

It will thus be noted that the waveform that is captured after detection of the variation exceeding the first variation threshold may consist of: digital line voltage information corresponding to a predetermined amount of time before and up to the detection; digital line voltage information corresponding to the time of the detection to a predetermined amount of time after the detection; or digital line voltage information corresponding to a predetermined time before to a predetermined time after the detection. In this manner, the waveform information directly surrounding the time a power quality event occurs is captured for subsequent analysis.

The use of a precision time standard clock provides a further advantage of allowing several meters having the capability of the meter 40 to record power quality event data having time stamps that are completely synchronized. For example, if a power quality event occurs and is detected by four meters in a several mile radius, then the waveforms captured at those four meters may be analyzed to determined how the power quality event affected the power network. Because each of the four meters employs a precision time standard clock, the captured waveform data from each meter can be corresponded exactly to waveforms from the other meters. Such information allows analysis of how a particular problem propagated through the network as well as other valuable power network analysis information.

In any event, after step 345, the voltage handler proceeds to step 350 of FIG. 7B. The portion of the flow diagram in FIGS. 7B and 7C illustrate an example of how end-of-event and sub-event waveform capture according to the present invention may be carried out. It is noted that when the voltage handler 230 executes step 350, the meter 40 has already detected and indeed is currently within a power quality event as defined by the first variation threshold.

At step 350, the voltage handler 230 again awaits and receives the voltage magnitude information, VOLT, from the FIR smoothing circuit 216. The voltage handler 230 then determines whether the variation of VOLT from an expected value is less than the first variation threshold (step 355). If so, then the voltage handler 230 proceeds to step 365. If not, however, then the voltage handler 230 proceeds to step 360. If the variation is less than the first variation threshold, then it may indicate that the present power quality event is ending and the line voltage is returning to within normal parameters.

Specifically, if the variation is less than the first variation threshold, then a second variation duration index L is reset to zero (step 360). The second variation duration index L is discussed in further detail below in connection with steps 410 to 420. The voltage handler 230 then increments the variation reduction duration index M (step 370). The voltage handler 230 then determines whether the index M is less than a predetermined variation reduction duration value. In particular, similar to the detection of the first variation in steps 310 to 325, the voltage handler 230 only records a reduction in the variation of the line voltage from the first variation threshold if there are a predetermined number of half-cycles in which the variation is below the first variation threshold.

If M does not exceed the variation reduction duration value, then the voltage handler 230 returns to step 350 to await further line voltage information. If, however, M exceeds the variation reduction duration value, then the voltage handler 230 performs the waveform capture operations described below in connection with steps 380 through 395. Accordingly, the meter 40 of the present invention performs waveform capture not only at the beginning of a power quality event, such as that detected in the operation of steps 330 through 345, but also at the end of a power quality event. To this end, the meter 40 performs waveform capture both when a variation of the line voltage exceeds a variation threshold and when the variation of the line voltage is reduced below the variation threshold.

In step 380, the voltage handler 230 resets M. The voltage handler 230 then records the time and date of the power quality event (step 385). In particular, the time and date information provided by the clock circuit 57 is written immediately to a buffer signifying the detection of a waveform capture event.

The voltage handler 230 also retrieves the circular buffer contents (step 390). In particular, as discussed above, the circular buffer contents include the previous MM cycles worth of waveform sample data. The voltage handler 230 generates a power quality event record comprising the circular buffer contents and the time and date information.

The voltage handler 230 then writes the record to a memory and/or communicates the record to the utility customer or the utility generator or supplier (step 395). As discussed above, it is often preferable to obtain several cycles of waveform sample data after the power quality event is identified in step 335. To this end, the voltage handler 230 may execute a subprocess in which the requisite number of additional line voltage samples are provided to the power quality event data record.

After step 395, the voltage handler 230 has determined that the line voltage magnitude has returned to within normal parameters. The voltage handler 230 than returns to step 305 of FIG. 7A and proceeds accordingly. Referring again to step 355, if it is determined that the variation of the present measure of VOLT is not below the first variation threshold, then the voltage handler 230 executes a sequence of operations that determine whether the variation of VOLT exceeds a second variation threshold, which could indicate a sub-event within the presently detected power quality event.

In particular, if in step 355 it is determined that the variation of VOLT is not below the first variation threshold, then the variation reduction duration index M is reset to zero (step 360). The voltage handler 230 then determines whether the variation of VOLT from a value representative of the expected line voltage exceeds the second variation threshold (step 405).

In particular, the second variation threshold corresponds to a second predetermined set point level that is in the same direction as the first set point level. In other words, if the first variation threshold that was exceeded was a variation of the line voltage below the expected voltage level, then the second variation threshold is a variation of the line voltage further below the expected voltage level. Conversely, if the first variation threshold that was exceeded was a variation of the line voltage above the expected voltage level, then the second variation is a variation of the line voltage further above the expected line voltage level.

If the variation is not greater than the second variation threshold, then the second variation duration counter L is reset to zero (step 415) and the voltage handler 230 returns to await further values of VOLT at step 350.

If, however, the variation is greater than the second variation threshold, then the voltage handler 230 increments the second variation duration index L (step 410). After the counter L is incremented, the voltage handler 230 determines whether L exceeds a predetermined second variation duration value (step 420). The second variation duration value represents a minimum number of half-cycles that the variation of VOLT must exceed the second variation threshold to trigger the waveform capture, which provides similar protections from spurious voltage anomalies as those discussed above in connection with step 325.

If the voltage handler 230 determines that L does not exceed the predetermined second variation duration value, then the voltage handler returns to step 350 to receive the next voltage magnitude value and proceed accordingly.

If, however, L exceeds the second variation duration value, then the voltage handler resets L (step 425) and obtains the time and date information corresponding to the detection (step 430). The voltage handler 230 also retrieves the circular buffer contents (step 435). The voltage handler 230 then generates a power quality event record comprising the circular buffer contents, the time and date information, and a predetermined number of post detection line voltage samples. The voltage handler 230 then writes the record to a memory and/or communicates the record to the utility customer or the utility generator or supplier (step 440).

Thus, once power quality event has been detected in steps 305 to 325, the meter 40 of the present invention monitors for a second level of variation of the line voltage (or line current) from an expected value. Such a second level of variation may be preprogrammed as a second set point into the meter 40 by an operator as discussed below in connection with FIG. 9. As discussed above, the meter 40 then captures the waveform of the line voltage at the time surrounding the detection of the second level of variation. Such information provides further, in depth information relating to a power quality event. Power providers, generators, and consumers may use such information to learn about how and why the event occurred, and what effect it may have had on the power consumer's equipment.

An exemplary use of the captured waveform data for two or more such nested levels of variation within a disturbance event is to plot the data in order to measure customer equipment response to the disturbance as compared to standard power quality tolerance curves. One such power quality disturbance curve is the Computer Business Equipment Manufacturing Association (CBEMA) curve, which is provided in I.E.E.E. standard 446.

Once the second variation power quality event record has been generated and stored and/or communicated in step 440, the voltage handler 230 then monitors the line voltage to detect when the variation is reduced to less than the second variation threshold (or first variation threshold). To this end, the voltage handler 230 executes the flow diagram illustrated in FIG. 7C, beginning with step 445. It is noted that in accordance with the flow diagram illustrated in FIG. 7C, the voltage handler 230 will cause waveform capture if the variation of VOLT falls below the second variation threshold and not the first variation threshold for a predetermined number of half-cycles. However, the voltage handler 230 also monitors whether the variation of VOLT from the expected value falls below the first variation threshold.

In step 445, the voltage handler 230 receives a voltage magnitude information value, VOLT, from the FIR smoothing circuit 216. The voltage handler 230 then determines whether the variation of VOLT from an expected value is less than the second variation threshold (step 450). If so, then the voltage handler 230 proceeds to step 455. If not, however, then the voltage handler 230 proceeds to step 460. In step 460, an index J, which represents the number of consecutive values of VOLT that varied from the expected value in an amount less than the second variation threshold, is reset to zero. After step 460, the voltage handler returns to step 445 to await the next value of VOLT.

In step 455, which is executed when the variation of VOLT does fall below the second variation threshold, the index J is incremented.

The voltage handler 230 then determines whether the variation of VOLT from an expected value is less than the first variation threshold (step 465). If so, then the voltage handler 230 increments the counter M (step 470) and then proceeds to step 480. If not, however, then the voltage handler 230 resets the value of M (step 475) and then proceeds to step 480. Steps 465 through 475 begin accumulation of the index M in the event that the line voltage returns to a value that is less than the first variation threshold before the value of J reaches the second variation reduction duration value. In other words, before the value of J is sufficient to signify that the sub-event represented by the second variation threshold is over, the line voltage may have returned to within its normal parameters. In such a case, the steps 465 through 475 begin incrementing the counter M for use when the voltage handler 230 returns to the flow diagram in FIG. 7B, as discussed further below.

The voltage handler 230 then determines whether J exceeds the second variation reduction duration value (step 480). In particular, similar to the detection of the first variation in steps 310 to 325, the voltage handler 230 only records a reduction in the variation of the line voltage from the second variation threshold if there are a predetermined number of half-cycles in which the variation is below the second variation threshold.

If J does not exceed the second variation reduction duration value, then the voltage handler 230 returns to step 445 to await further line voltage information. If, however, M exceeds the second variation reduction duration value, then the voltage handler 230 performs the waveform capture operations described below in connection with steps 485 through 500. Accordingly, the meter 40 of the present invention performs waveform capture not only at the beginning and end of a power quality event, such as described above in connection with steps 330 through 395, but also at the beginning and end of a power quality sub-event within a power quality event. To this end, the meter 40 performs waveform capture both when a variation of the line voltage exceeds each of two variation thresholds and when the variation of the line voltage is reduced below one or both of those variation thresholds.

In step 485, the voltage handler 230 resets J. The voltage handler 230 then records the time and date of the power quality event (step 490). In particular, the time and date information provided by the clock circuit 57 is written immediately to a buffer signifying the detection of the waveform capture event.

The voltage handler 230 also retrieves the circular buffer contents (step 495). The voltage handler 230 generates a power quality event record comprising the circular buffer contents, the time and date information, and a predetermined number of post detection line voltage samples.

The voltage handler 230 then writes the record to a memory and/or communicates the record to the utility customer or the utility generator or supplier (step 500). After step 500, the voltage handler returns to step 375 of FIG. 7B and proceeds accordingly to determine whether the value of VOLT has varied from the expected value less than the amount of the first variation threshold for enough cycles to indicate that the entire power quality event is over.

It will be appreciated that the use of two nested variation thresholds, as discussed above in connection with FIGS. 7A, 7B and 7C, is given by way of example only. Those of ordinary skill in the art may readily modify the embodiment described herein to accommodate three or more nested variation thresholds corresponding to three or more user-defined set points.

As discussed above, the power quality event data records generated by the voltage handler 230 are provided to memory within the meter or to data communication ports 41–44 as the measuring by the meter 40 continues. This signal variation information provided by the voltage handler 230 of the meter 40 which reflects the quality of power not only provides competitive information for utility companies and customers thereof, but also provides troubleshooting information for utility companies and customers in areas of power distribution such as through a secondary distribution system.

The meter 40 of the present invention may further include circuitry for performing energy management functions. FIG. 8A shows a functional block diagram of an energy management controller 90 that may be incorporated into the meter 40 of FIG. 3.

In general, the revenue accuracy meter 40 receives a signal from a temperature controller or HVAC controller from a customer 60 into a transducer 91. A signal is responsively converted to an electrical signal by the transducer 91 and compared to temperature, or other energy system data, to desired predetermined settings 92. This data is then analyzed by an energy analyzer 95 preferably to analytical calculate optimum desired settings based on power cost or billing data 94 and/or to perform various load curtailment functions. The analyzer 95 then responsively communicates to a power customer's energy system to adjust temperature or other energy system settings 93 as illustrated. Blocks 92, 94 and 95 may suitably be carried out by the microprocessor 48.

Because the revenue accuracy meter 40 preferably includes a power quality circuit 200, the energy management controller 90 of the meter 40 can advantageous include real time information to the power customer 60 about the quality of power received and how this affects the customer's energy usage and control capabilities. Additionally, this information can then be used to adjust billing calculations or projected energy usage costs related to the quantity of power used and/or the quality of the power supplied from the power generator 80. It will also be understood by those skilled in the art that such a meter 40 according to the invention may also include information related to a third party or same party power generator such as a large industrial company, i.e., cogeneration.

The energy management controller 90 also preferably provides centralized data retrieval and management from the energy analyzer 95 responsive to predetermined command signals from a customer 60. These functional capabilities preferably include spreadsheet interface, basic reporting, record-keeping, overall system control, enhanced user interfaces, and other real-time access to energy utilization data for statistical manipulation and graphic presentation to the customer 60. These manipulation capabilities preferably are software driven with computer programs resident in a microprocessor or memory in communication therewith, and preferably include kilowatt load curves for day, week, and month, kilowatt duration curves, kVA/kQ load curves, power factor curves, energy worksheets, demand worksheets, excessive reactive worksheets, fuel recovery, contract minimum demand, rate worksheets, billing dates table, demand history table, season demand multiplier table, and predictive monitoring. The communication is preferably through a modem or other data communication interface, i.e., data communication ports 41–44, with the customer 60 as understood by those skilled in the art.

Also, according to the present invention as described above and as further illustrated in FIGS. 1–8, methods of measuring the quality of power received by a power customer 60 are provided. The method of the present invention preferably includes determining frequency and duration of undesired variations in an electrical signal representative of power received by a power customer 60 across electrical power lines during a plurality of predetermined time periods and communicating a signal representative of the undesired power variations to a power generator 80. The method preferably further includes measuring power usage of a power customer 60 responsive to an electrical signal representative of a customer load and communicating a signal representative of the amount of power used responsive to a command signal received from a power generator 80 or other entity.

Another method of measuring the quality of power supplied across electrical power lines by a power generator 80 is further provided by the present invention. The method preferably includes receiving an analog signal representative of voltage received across electrical power lines and converting the received analog signal to a digital signal representative of the voltage. The frequency and duration of undesired variations in the digital voltage signal during a plurality of predetermined time periods are then determined. The data representative of these undesired variations are then stored and signals representative of the frequency and duration variations are transmitted to a power generator 80 responsive to a predetermined command signal received from the power generator 80. The step of determining frequency and duration of undesired variations preferably includes comparing a voltage signal to a predetermined voltage threshold value and determining a time period that the voltage signal is above or below the predetermined voltage threshold value. Further, the methods preferably also includes measuring power usage of a power customer responsive to an electrical signal representative of a customer load, and communicating a signal representative of the amount of power used responsive to a command signal received from a power generator. The power usage also may then be controlled responsive to predetermined command signals received from a power customer.

By providing power quality and power usage measurement, as well as other beneficial functions such as energy management control 90, in a revenue accuracy meter, the meter 40, and associated methods, of the present invention provides a compact and relatively inexpensive solution to problems associated with prior devices and systems. Additionally, the data communications capabilities of a revenue accuracy meter 40 of the invention enhances a power generator's capability to monitor power quality situations at specific customer sites, i.e., including problems in the secondary power distribution system 36, remote from the power generating stations 21 or SCADA control facilities 22. These problems, for example, may include harmonic distortion, surges, sags, or other disturbances that greatly affect the quality of power received by the power customer 60 at its industrial/commercial facility 41 or residence 42.

Figure 9:
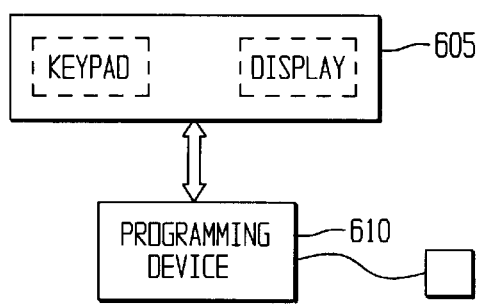
FIG. 9 schematically illustrates an apparatus for providing control parameters to the revenue accuracy meter of FIGS. 3 and 4 in accordance with the present invention.

FIG. 9 shows a block diagram of a control programmer 600 for use in connection with the meter 40. In particular, the control programmer 600 is a device that may be used to program control parameters into the meter 40. The control programmer 600 may be a stand alone, portable programmer or laptop computer that communicates through the optical port in the meter 40, or may be a remote computer that communicates through one or more of the other communication ports 41, 42, 43, or 44.

The control programmer 600 includes a user interface 605 operable to receive control parameters for the meter 40, including information identifying a first variation threshold and the second variation threshold. To this end, the user interface 605 may suitably include a keypad or keyboard input device and a display for feedback.

The control parameters may further include metering calibration values, user defined configurations of reports obtained by the meter 40, and on/off controls for various meter features. The first and second variation thresholds may suitably be provided as first and second set points above the expected line voltage and first and second set points below the expected line voltage. Other power quality related parameters may include the number of waveform cycles before and after an event which are to be captured (timing parameters), the first and second variation duration values, the first and second variation reduction values, the number of events stored in non-volatile memory as opposed to volatile memory.

Still other control parameters may define whether, when, how and where to automatically communicate power quality event records. Such parameters may be used to provide differing quantities of power quality event records to different external locations using different communication methodologies. Accordingly, the meter 40 is preferably configured to provide flexible captured waveform communication capabilities in addition to the above described advantages.

Coupled to or integral with the user interface 605 is a programming device 610. The programming device 610 is a device that is configured to provide information to the electrical meter 40. In particular, the programming device 610 is operable to communicate the control parameters identified above to the electrical energy meter 40. To this end, the programming device 610 may suitably convert the control parameters in the form obtained by the user interface 605 to a table of parameter values in a form that is utilized by the meter 40.

The programming device 610 then communicates the control parameters through one of the communication ports 41, 42, 43, and 44. The table of parameter values may suitably be stored in the meter 40 in the non-volatile memory 53. The microprocessor 48 and/or DSP circuit 45 may then download and/or retrieve the parameters as necessary.

In the drawings and specification, there have been disclosed typical preferred embodiments of a revenue accuracy meter 40, and associated methods, according to the invention and, although specific terms are employed, they are used in a descriptive sense only and not for purposes of limitation. The invention has been described in considerable detail with specific reference to these various illustrated embodiments. It will be apparent, however, that various modifications and changes can be made within the spirit and scope of the invention as described in the foregoing specification and as defined in the appended claims.

For example, while the above-described embodiments show a power quality meter in which multiple set points for waveform capture are preprogrammed into the meter 40, waveform capture may also be, or alternatively be, triggered through receipt of an externally-generated trigger signal, such as one received through one of the communication ports 41, 42, 43, 44.

Moreover, it is noted that the source of externally-generated time standard information could alternatively be a communication receiver that is coupled to a time standard source within another meter. For example, if several meters are located on a local area network, it is possible to have only one meter that includes a GPS, WWV OR IRIG receiver and to have that meter communicate the calendar clock information to the other meters on the LAN periodically to calibrate all the clocks.

Finally, while the exemplary embodiment described above focuses primarily on handling detected line voltage variations, it may be advantageous in some circumstances to provide the waveform capture features of the present invention in connection with other line energy variations, such as line current variations.

What is claimed is:

1. An electrical energy meter comprising:
   a voltage digitizing circuit operable to obtain analog line voltage information and generate digital line voltage information therefrom;
   a current digitizing circuit operable to obtain analog line current information and generate digital line current information therefrom;
   a metering circuit operable to receive the digital line voltage information and the digital line current information and generate metering information therefrom;
   a clock circuit operable to generate calendar/clock information, said clock circuit having a calibration input for receiving precision time calibration information;
   a source of externally-generated time standard information operably coupled to provide the precision time calibration information to the calibration input of the clock circuit; and
   a power quality circuit operable to
      receive the digital line voltage information and obtain magnitude information therefrom, the magnitude information representative of the magnitude of the line voltage,
      detect a variation in magnitude of the line voltage relative to an acceptable voltage level, wherein the variation exceeds a first variation threshold,
      obtain calendar/clock information from the clock circuit, the calendar/clock information corresponding to a time at which the variation in the magnitude of the line voltage is detected,
      capture a first waveform in the form of a first set of digital line voltage information corresponding to the time when said variation is detected, and
      generate an event record including the calendar/clock information and the captured first waveform.

2. The electrical energy meter of claim 1 where in the clock circuit includes a crystal oscillator.

3. The electrical energy meter of claim 1 wherein the source of externally generated time standard information comprises a global positioning satellite receiver operable to receive time standard information from a global positioning satellite.

4. The electrical energy meter of claim 1 wherein the source of externally generated time standard information comprises an IRIG receiver.

5. The electrical energy meter of claim 1 wherein the power quality circuit further comprises a memory for storing the generated event record.

6. The electrical energy meter of claim 1 further comprising a communication circuit, the communication circuit connected to the power quality circuit and operable to communicate the generated event record to a remote device.

7. A system for metering loads on an electrical utility service and for obtaining power quality information regarding an electrical utility distribution system, the system comprising:
- a plurality of electrical energy meters coupled to said electrical utility distribution system, each of the electrical energy meters operably connected to a load to meter electrical energy consumed thereby, each of the electrical energy meters further comprising
  - a clock circuit operable to receive pulsed time information and generate calendar/clock information therefrom;
- a source of externally-generated time standard information operably coupled to provide pulsed time information to the clock circuit; and
- a power quality circuit operable to
  - obtain magnitude information representative of the magnitude of a line voltage on the energy distribution network,
  - detect a variation in magnitude of the line voltage, relative to an acceptable voltage level, wherein the variation exceeds a first variation threshold,
  - obtain calendar/clock information from the clock circuit, the calendar/clock information corresponding to a time at which the variation in the magnitude of the line voltage is detected,
  - capture a first waveform in the form of a first set of digital line voltage information corresponding to the time when said variation is detected, and
  - generate an event record including the calendar/clock information and the captured first waveform.

8. The system of claim 7 wherein each clock circuit of each electrical energy meter includes a crystal oscillator.

9. The system of claim 7 wherein each source of externally generated time standard information of each electrical energy meter comprises a global positioning satellite receiver operable to receive time standard information from a global positioning satellite.

10. The system of claim 7 wherein each source of externally generated time standard information of each electrical energy meter comprises an IRIG receiver.

11. The system of claim 7 wherein each power quality circuit further comprises a memory for storing the generated event record.

12. The electrical energy meter of claim 7 further comprising a communication circuit, the communication circuit connected to the power quality circuit and operable to communicate the generated event record to a remote device.

13. In an electrical energy meter containing means therein for metering a quantity of electrical energy generated by a supplier and transferred via a power supply line to a load of a customer during an energy measurement time interval, a method of creating data records comprising the steps of:
- a) sensing a line voltage transferred via the power supply line to the load during the energy measurement time interval;
- b) generating clock/calendar information;
- c) periodically adjusting said clock/calendar information using externally generated time standard information;
- d) detecting a variation in a magnitude of the sensed line voltage relative to an acceptable voltage level, wherein the variation exceeds a first variation threshold; and
- e) creating a data record comprising information relating to the detected variation and the clock/calendar information corresponding to the time of the detection, wherein said information includes a captured first waveform corresponding to the time of the detection.

14. The method of claim 13 further comprising the steps of:
- f) detecting a subsequent reduction in the variation of the magnitude of the sensed line voltage such that the variation is equal to or less than the first variation threshold;
- g) creating a subsequent data record comprising a captured second waveform corresponding to the time said subsequent reduction is detected and the clock/calendar information corresponding to the time said subsequent reduction is detected.

15. The method of claim 13 wherein step d) further comprises detecting a variation in a magnitude of the sensed line voltage relative to an acceptable voltage level wherein said variation comprises a decrease in said sensed line voltage below the acceptable voltage level.

16. The method of claim 13 wherein step d) further comprises detecting a variation in a magnitude of the sensed line voltage relative to an acceptable voltage level wherein said variation comprises an increase in said sensed line voltage above the acceptable voltage level.

17. The method of claim 13 wherein step e) further comprises storing the data record in a non-volatile memory.

18. The method of claim 13 further comprising the step of communicating the data record to an external device.

19. The method of claim 18, wherein said communicating step comprises transferring the data record from a modem internal to the meter to a telephone line operatively connected thereto via a data port.

20. The method of claim 13 further comprising the steps of:
- f) detecting a subsequent variation in a magnitude of the sensed line voltage from an acceptable voltage level that exceeds the first variation threshold and a second variation threshold; and
- g) creating a subsequent data record comprising relating to the detected subsequent variation and the clock/calendar information corresponding to the time of the subsequent variation detection.

21. The method of claim 20 further comprising the steps of:
- detecting a subsequent reduction in the variation of the magnitude of the sensed line voltage such that the variation is equal to or less than the second variation threshold and greater than the first variation threshold;
- creating a second subsequent data record comprising relating to the detected subsequent reduction in variation and the clock/calendar information corresponding to the time of the subsequent variation reduction detection.

22. The method of claim 13 further comprising the step of obtaining user input identifying the first variation threshold.

23. The method of claim 13 wherein the captured first waveform included in the data record corresponds to the sensed line voltage prior to, contemporaneous with, and subsequent to the detection of said variation.

* * * * *